United States Patent
Matsuda et al.

(10) Patent No.: US 6,466,108 B2
(45) Date of Patent: Oct. 15, 2002

(54) SURFACE ACOUSTIC WAVE RESONATOR AND FILTER USING THE SAME WITH SPECIFIED DISTANCE BETWEEN AN INTERDIGITAL TRANSDUCER AND REFLECTOR

(75) Inventors: Takashi Matsuda, Kawasaki (JP); Jun Tsutsumi, Kawasaki (JP); Shogo Inoue, Kawasaki (JP); Osamu Ikata, Kawasaki (JP)

(73) Assignees: Fujitsu, Limited, Kawasaki (JP); Fujitsu Media Devices Limited, Suzaka (JP)

( * ) Notice: Subject to any disclaimer, the term of this patent is extended or adjusted under 35 U.S.C. 154(b) by 0 days.

(21) Appl. No.: 09/771,877

(22) Filed: Jan. 30, 2001

(65) Prior Publication Data

US 2002/0036549 A1 Mar. 28, 2002

(30) Foreign Application Priority Data

Sep. 28, 2000 (JP) .................................. 2000-296713

(51) Int. Cl.⁷ .............................. H03H 9/64; H03H 9/25
(52) U.S. Cl. .................. 333/193; 333/195; 310/313 B; 310/313 D
(58) Field of Search ............................... 333/193–195; 310/313 R, 313 B, 313 C, 313 D

(56) References Cited

U.S. PATENT DOCUMENTS

| | | | | |
|---|---|---|---|---|
| 3,886,504 A | * | 5/1975 | Hartmann et al. | ........... 333/195 |
| 4,162,465 A | * | 7/1979 | Hunsinger et al. | ...... 333/194 X |
| 4,249,146 A | * | 2/1981 | Yen et al. | .................... 333/195 |
| 4,635,009 A | * | 1/1987 | Ebata | .......................... 333/195 |
| 4,742,319 A | * | 5/1988 | Sone | ........................... 333/195 |
| 5,589,806 A | * | 12/1996 | Taguchi et al. | .............. 333/193 |
| 5,818,146 A | * | 10/1998 | Kurahashi et al. | ...... 333/195 X |
| 5,831,493 A | * | 11/1998 | Ushiroku | .................... 333/193 |
| 6,025,763 A | * | 2/2000 | Morimoto | ..................... 333/195 |
| 6,150,900 A | * | 11/2000 | Kadota et al. | .............. 333/133 |
| 6,172,582 B1 | * | 1/2001 | Hickernell | ................... 333/195 |
| 6,326,864 B1 | * | 12/2001 | Takamine et al. | ........... 333/133 |

* cited by examiner

*Primary Examiner*—Robert Pascal
*Assistant Examiner*—Barbara Summons
(74) *Attorney, Agent, or Firm*—Armstrong, Westerman & Hattori, LLP

(57) ABSTRACT

A surface acoustic wave resonator includes a piezoelectric substrate having formed thereon a interdigital transducer part comprising plural electrode fingers having a period pi that is substantially equal to a wavelength of a surface acoustic wave to be excited, and at least one reflector arranged in the vicinity of the interdigital transducer part to reflect the surface acoustic wave excited by the interdigital transducer part in a direction parallel to a propagation direction of the surface acoustic wave. The interdigital transducer part has three or more electrode fingers within the period pi, and the reflector has plural gratings having a period pr that is equal to a half of a wavelength of a surface acoustic wave propagating in the reflector.

6 Claims, 24 Drawing Sheets

CHARACTERISTICS OF RESONATOR CONNECTED IN PARALLEL
(A-B DISTANCE: pi x 6/16)

CHARACTERISTICS OF RESONATOR CONNECTED IN PARALLEL
(A-B DISTANCE: pi x 5/16)

SURFACE ACOUSTIC WAVE RESONATOR AND FILTER USING THE SAME WITH SPECIFIED DISTANCE BETWEEN AN INTERDIGITAL TRANSDUCER AND REFLECTOR

CROSS-REFERENCE TO RELATED APPLICATION

This application is related to Japanese Patent Application No. 2000-296713 filed on Sep. 28, 2000, whose priority is claimed under 35 USC §119, the disclosure of which is incorporated by reference in its entirety.

BACKGROUND OF THE INVENTION

1. Field of the Invention

The present invention relates to a surface acoustic wave resonator and a surface acoustic wave filter using the same, particularly a ladder type filter.

2. Description of the Related Art

A surface acoustic wave filter and a resonance circuit using a surface acoustic wave resonator can be provided with a compact size and a low cost. Therefore, a surface acoustic wave resonator is one of the necessary constitutional elements for reducing the size of recent communication equipments, such as a portable phone.

FIG. 17 is a constitutional diagram showing a conventional ordinary surface acoustic wave resonator.

The surface acoustic wave resonator comprises a piezoelectric substrate 1 having thereon a interdigital transducer (IDT) 2 formed with an aluminum alloy having a period corresponding to a desired frequency, and reflectors 3-1 and 3-2 reflecting a surface acoustic wave excited by the interdigital transducer 2. The electrode period pi of the interdigital transducer 2 can be obtained from the velocity vi of the surface acoustic wave on the substrate at the interdigital transducer and the desired frequency fi by the following equation:

$$pi = vi/fi$$

The surface acoustic wave resonator shown in FIG. 17 is a single terminal pair resonator, in which one of the end parts of the interdigital transducer 2 is an input electrode 2-1, to which an input signal is applied, and the other thereof is an output electrode 2-2, from which an output signal is taken out. The reflectors 3-1 and 3-2 are generally formed with a grating having periodicity.

While the grating can be formed by making grooves on the piezoelectric substrate, an aluminum alloy grating is generally used, which can be formed simultaneously with the interdigital transducer.

The grating period pr can be obtained, as similar to the case of the interdigital transducer, from the velocity vr of the surface acoustic wave at the reflector and the desired frequency fr by the following equation:

$$2 \times pr = vr/fr$$

In general, as fi=fr, assuming that vi and vr are substantially the same as each other, the design is often made with pi=2×pr.

Herein, twice the grating period pr is sometimes referred to as a period of the reflector. In this case, the reflector is sometimes referred to as "a half-period reflector".

In general, the interdigital transducer 2 has been formed with a single electrode comprising two electrode fingers within the electrode period pi. The reflector has also been generally formed with a single electrode as similar to the interdigital transducer 2 since two grating electrode fingers 3-3 are present within twice the grating period pr, which is the same as the electrode period pi.

The single electrode herein has such a constitution that the electrode fingers of the interdigital transducer are arranged where one electrode finger extending from the end part of the input electrode 2-1 and one electrode finger extending from the end part of the output electrode 2-2 are alternately arranged. That is, one electrode finger extending from the end part of the output electrode 2-2 is necessarily arranged between two adjacent electrode fingers extending from the end part of the input electrode 2-1.

The electrode fingers thus alternately arranged each are referred to as a single electrode finger.

FIG. 18 is a constitutional diagram showing a conventional double terminal pairs resonator comprising plural interdigital transducers, in which numerals 2-3 and 2-4 denote ground terminals.

FIG. 19 is a diagram showing the simplest electrically equivalent circuit of a single terminal pair surface acoustic wave resonator formed on a piezoelectric substrate 1, such as quartz and LiTaO$_3$. A single terminal pair surface acoustic wave resonator is used by electrically connected in serial or in parallel as shown in FIGS. 20(a) and 20(b) or FIGS. 21(a) and 21(b).

In FIG. 19, symbol R1 denotes a resistance, C0 and C1 denote capacitance, Li denotes an inductance, Ti denotes a terminal of the input electrode 2-1, and To denotes a terminal of the output electrode 2-2.

Herein, R1, C1 and L1 are such values that are determined by the material of the piezoelectric substrate, and C0 is a value varying depending on the number of pairs of the interdigital transducers.

In the case of the serial connection shown in FIG. 20(a), a single terminal pair surface acoustic wave resonator R is arranged in serial between the input Ti and the output To as shown in FIG. 20(b). In the case of the parallel connection shown in FIG. 21(a), a single terminal pair surface acoustic wave resonator R is arranged in parallel between the pair of the input Ti and the output To, and the ground G as shown in FIG. 21(b).

FIG. 22 is a diagram showing general frequency characteristics in the case where the single terminal pair surface acoustic wave resonator is connected in serial. Herein, the abscissa indicates the frequency (Hz), and the ordinate indicates the attenuation amount (dB). According to the diagram, the attenuation amount exhibits the maximum value at a certain frequency, which is referred to as an antiresonance frequency fas.

FIG. 23 is a diagram showing impedance characteristics in the case where the single terminal pair surface acoustic wave resonator is connected in serial. Herein, the abscissa indicates the frequency, and the ordinate indicates the absolute value of impedance (logarithmic value). According to the diagram, double resonance characteristics are observed, in which a resonance frequency frs, at which the impedance shows the minimum, appears on the low frequency side, and an antiresonance frequency fas, at which the impedance shows the maximum, appears on the high frequency side.

FIG. 24 is a diagram obtained by overlapping FIG. 22 and FIG. 23. In this figure, a part to be a pass band of the ladder type filter and a part to be an attenuation band of the ladder type filter are shown.

FIG. 25 is a diagram showing general frequency characteristics in the case where the single terminal pair surface acoustic wave resonator is connected in parallel, and FIG. 26 is a diagram showing impedance characteristics in the case where the single terminal pair surface acoustic wave resonator is connected in parallel. Herein, the ordinate of FIG. 25 indicates the absolute value of admittance (logarithmic value).

In these figures, the frequency, at which the attenuation amount becomes minimum, is the resonance frequency frp, the frequency, at which the admittance becomes maximum, is the resonance frequency frp, and the frequency, at which the admittance becomes minimum, is the antiresonance frequency fap. In the case of the parallel connection, the double resonance characteristics having two resonance frequencies frp and fap are exhibited.

The surface acoustic wave resonator of this type is used singly or as a combination of plurality thereof as a ladder type filter. FIG. 27 is a constitutional diagram showing an example of the ladder type filter. In the ladder type filter as shown in FIG. 27, several surface acoustic wave resonators ($S_1$, $S_2$, $R_1$ and $R_2$) are connected in parallel and serial. At this time, the interdigital transducers of the respective resonators are designed in such a manner that the antiresonance frequency fap of the parallel resonators $R_1$ and $R_2$ substantially agree with the resonance frequency frs of the serial resonators $S_1$ and $S_2$.

FIG. 28 is a diagram showing general frequency characteristics of a ladder type filter. The ladder type filter is a band pass filter passing a certain frequency band.

Characteristic values demanded in a band pass filter include the pass band width BW1 which is shown in FIG. 28, the attenuation band widths BWatt1 and BWatt2, and the attenuation degrees of the attenuation bands ATT1 and ATT2.

The ratio (BW1/BW2) of the band widths BW1 and BW2 at a certain attenuation amount is referred to as a shape factor, which is used as a characteristic value in the case where steep characteristics of the band are required. In general, the better, the closer the shape factor is to 1, which provides a filter of high squareness.

Representing the center frequency of the pass band of the filter by f0, the values obtained by normalizing BW1 and BW2 with the center frequency f0 (BW1/f0 and BW2/f0) are referred to as fractional band witdths.

As shown in the characteristic diagram of the serial resonator in FIG. 24, the right hand part of the antiresonance frequency fas is a part to be an attenuation band of the ladder type filter, which corresponds to the part of BWatt2 in FIG. 28.

The part of flat pass characteristics on the left hand of the antiresonance frequency frs in the vicinity of the antiresonance frequency frs in FIG. 24 is a part to be a pass band of the ladder type filter, which corresponds to the part BW1 in FIG. 28.

In the ladder type filter, as understood from FIG. 24 and FIGS. 22 and 25, the pass band widths BW1 and BW2 are substantially determined by the distance between the antiresonance frequency fas of the serial resonator and the resonance frequency frp of the parallel resonator.

The resonance frequency frs and the antiresonance frequency fas of the surface acoustic wave resonator are substantially determined by the material of the piezoelectric substrate 1. In particular, the band width of the ladder type filter is substantially determined by the electromechanical coupling coefficient among the characteristics of the piezoelectric substrate material.

For example, while a frequency of f0=836.5 MHz is used in AMPS (Advanced Mobile Phone Service) in the U.S., the characteristic values of the specification thereof demand a pass band width of 25 MHz and a fractional band witdth of about 3%. Such a band pass filter of wide band has been realized only by a piezoelectric substrate of a high electromechanical coupling coefficient, such as 36° Y-cut X-propagation $LiTaO_3$.

When a piezoelectric substrate having a large electromechanical coupling coefficient is used, a band pass filter of wide band can be obtained since the resonance and antiresonance frequencies of the surface acoustic wave resonator are apart from each other. However, the shape factor is deteriorated at the same time. That is, there is a tendency that the shape factor becomes small when the fractional band witdth is increased.

The resonance and antiresonance frequencies are substantially determined by the piezoelectric substrate since the electromechanical coupling coefficient is a value inherent in the substance, and they cannot be arbitrarily obtained. Therefore, it has been difficult to adjust the fractional band witdth and the shape factor to the desired values.

SUMMARY OF THE INVENTION

The present invention relates to a surface acoustic wave resonator comprising a piezoelectric substrate, a interdigital transducer part which is formed on a piezoelectric substrate and is composed of plural electrode fingers having a period pi that is substantially equal to a wavelength of a surface acoustic wave to be excited, and at least one reflector arranged in the vicinity of the interdigital transducer part to reflect the surface acoustic wave excited by the interdigital transducer part in a direction parallel to a propagation direction of the surface acoustic wave, wherein the interdigital transducer part has three or more electrode fingers within the period pi, and the reflector is composed of plural gratings having a period pr that is equal to a half of a wavelength of a surface acoustic wave propagating in the reflector.

According to the present invention having the specific structure of the interdigital transducer of the surface acoustic wave resonator, the distance between the resonance frequency and the antiresonance frequency of the surface acoustic wave resonator is decreased even though the same piezoelectric substrate material as the conventional art is employed, and in the case of a ladder type filter, a filter of higher squareness can be realized with the demanded fractional band width.

DESCRIPTION OF THE PREFERRED EMBODIMENTS

The present invention provides a surface acoustic wave resonator comprising a piezoelectric substrate, a interdigital transducer part which is formed on a piezoelectric substrate and is composed of plural electrode fingers having a period pi that is substantially equal to a wavelength of a surface acoustic wave to be excited, and at least one reflector arranged in the vicinity of the interdigital transducer part to reflect the surface acoustic wave excited by the interdigital transducer part in a direction parallel to a propagation direction of the surface acoustic wave, wherein the interdigital transducer part has three or more electrode fingers within the period pi, and the reflector is composed of plural gratings having a period pr that is equal to a half of a wavelength of a surface acoustic wave propagating in the reflector.

It is possible that the electrode fingers of the interdigital transducer part and the gratings of the reflector comprise electrodes having the same material and the same thickness.

It is possible that the period pr is a half of the period pi.

It is possible that the electrode finger of the interdigital transducer part and the grating of the reflector comprise a material of either aluminum or an aluminum alloy. The piezoelectric substrate may be formed with 42° Y-cut X-propagation $LiTaO_3$. The grating of the reflector may be formed with a groove formed on the piezoelectric substrate instead of the grating electrode constituted by electrodes.

It is preferred in the invention that a distance L between a center position of a width of a propagation direction of a surface acoustic wave of one grating that is the nearest to the interdigital transducer part among the gratings of the reflector and a center position of a width of a propagation direction of a surface acoustic wave of a single electrode finger, assuming that the single electrode finger is the nearest electrode finger to the reflector among the electrode fingers of the interdigital transducer part, is from $(n/2+5/16)$ times to $(n/2+6/16)$ times (n=0 and a positive integer) a wavelength $\lambda$ of the surface acoustic wave excited by the interdigital transducer part.

The present invention also provides a ladder type surface acoustic wave filter comprising the surface acoustic wave resonators connected in serial and/or parallel, wherein at least one of the surface acoustic wave resonators comprises the surface acoustic wave resonator having the foregoing constitution.

It is possible in the ladder type surface acoustic wave filter that among the surface acoustic wave resonators, only surface acoustic wave resonators connected in serial comprise the surface acoustic wave resonator having the foregoing constitution.

The present invention will be described in more detail below with reference to the embodiments shown in the figures, but the invention is not construed as being limited thereto.

Figure 17:
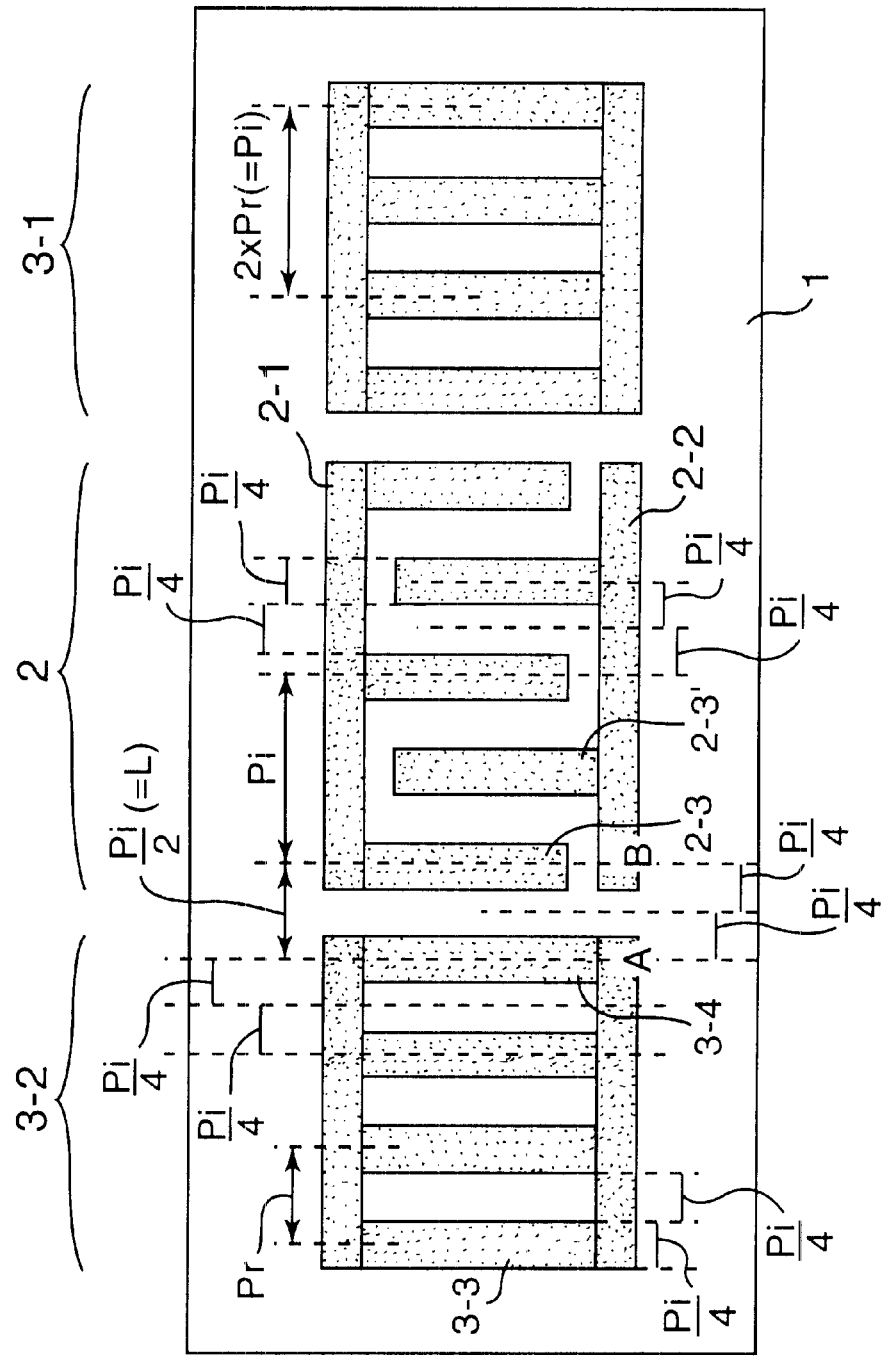
FIG. 17 is a constitutional diagram showing a conventional single terminal pair surface acoustic wave resonator.
Figure 18:
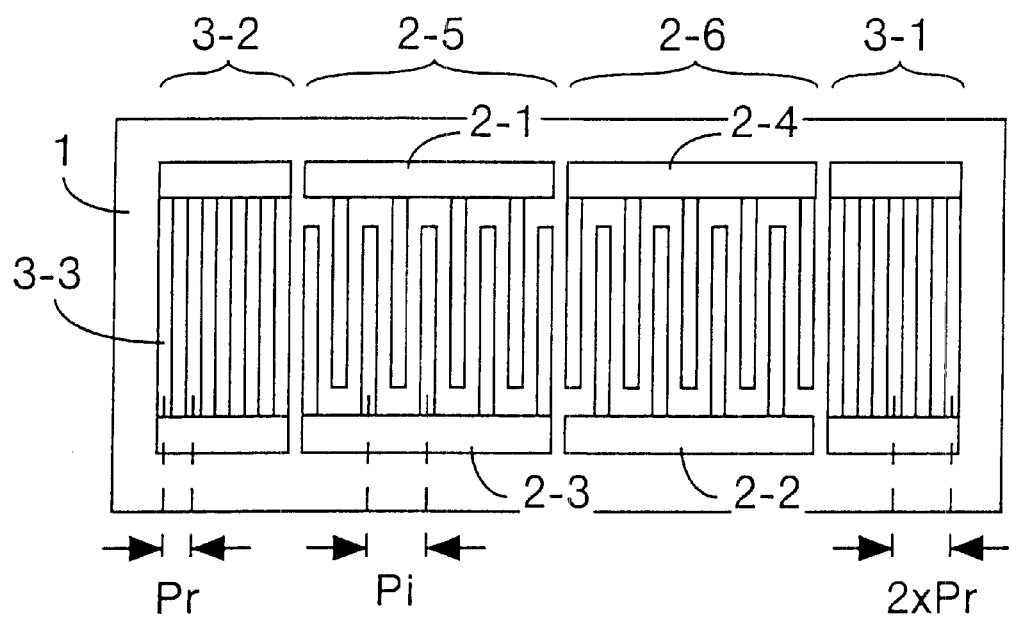
FIG. 18 is a constitutional diagram showing a conventional double terminal pair surface acoustic wave resonator.
Figure 19:
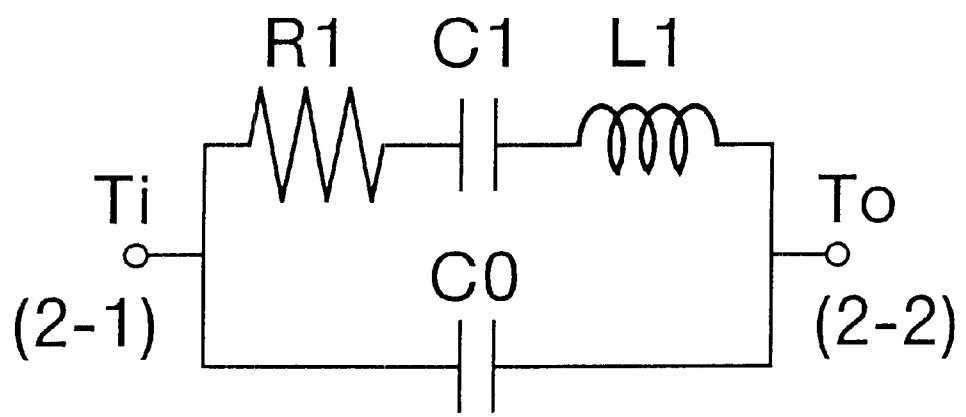
FIG. 19 is a diagram showing an equivalent circuit of a conventional single terminal pair surface acoustic wave resonator.

FIG. 17 shows a constitutional diagram of a conventional single terminal pair surface acoustic wave resonator having been employed, in which the number of the electrode fingers present within the period pi of the interdigital transducer is two. In the case where the interdigital transducer and the reflector are formed with the same structure, for example, with an Al thin film, the period pi of the interdigital transducer 2 and the period pr of the reflectors 3-1 and 3-2 have been designed to have the relationship, pi=2×pr.

The distance L between the center A in the propagation direction of the grating electrode 3-4 that is the nearest to the interdigital transducer 2 among the grating electrodes constituting the reflectors 3-1 and 3-2 and the part B corresponding to the center in the propagation direction of the electrode finger 2-3 that is the nearest to the reflector is $\lambda/2$, where $\lambda$ is the wavelength of the propagating surface acoustic wave, and $\lambda$=pi. The width of the electrode fingers of the interdigital transducer and the grating electrodes of the reflector is pi/4, and the distances among the electrode fingers are $\lambda/4$.

EXAMPLE 1

Figure 1:
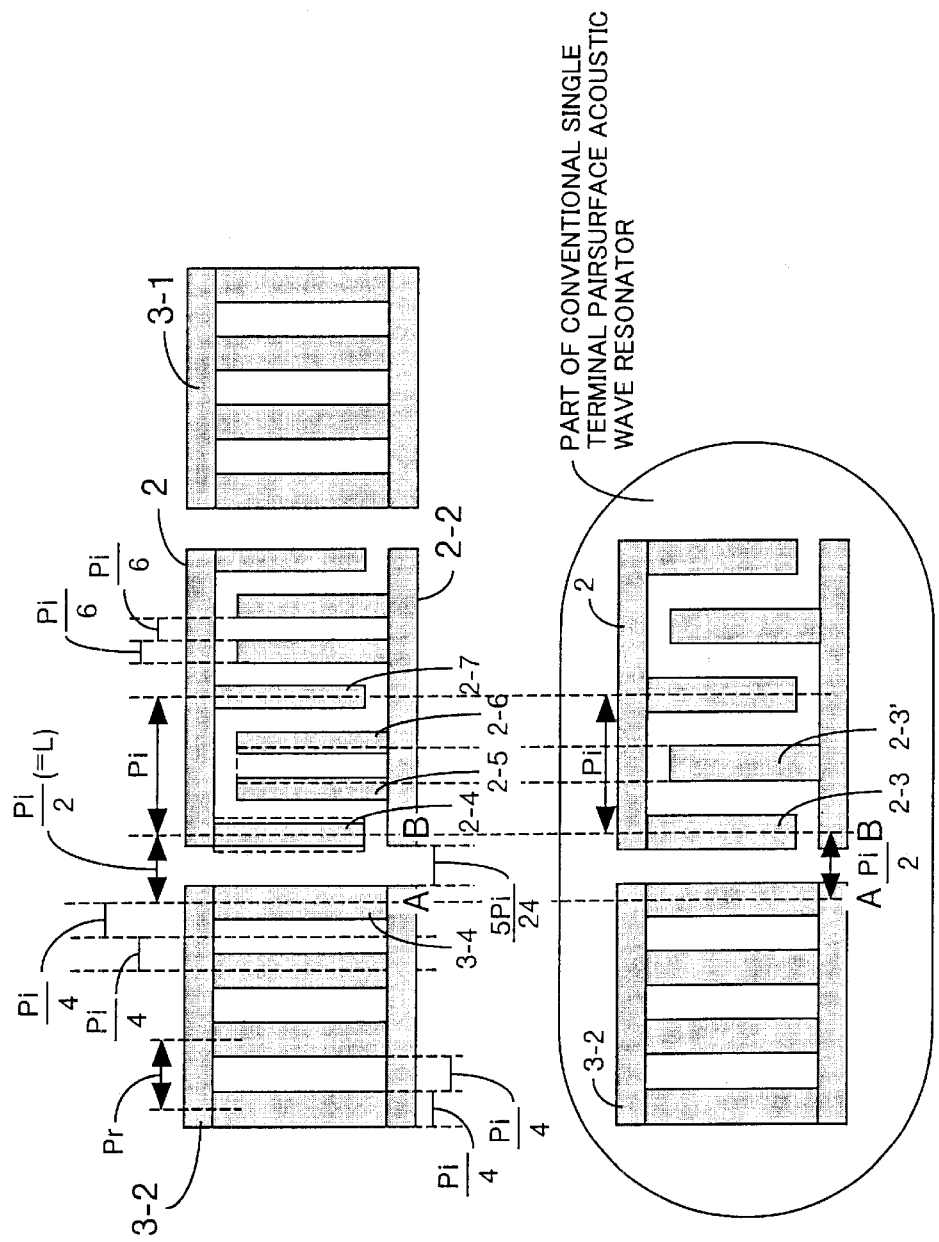
FIG. 1 is a constitutional diagram showing an example of a single terminal pair surface acoustic wave resonator according to the invention.

FIG. 1 is a constitutional diagram of an example of a single terminal pair resonator according to the invention that has three electrode fingers within the period pi of the interdigital transducer.

In the invention, the period pr of the grating electrodes of the reflector is made equal to a half of the wavelength $\lambda r$ of the surface acoustic wave propagating to the reflector after excitation by the interdigital transducer fingers (i.e., pr=$\lambda r/2$).

In general, the wavelength $\lambda i$ of the surface acoustic wave excited by the interdigital transducer is designed to be equal to the period pi of the electrode fingers of the interdigital transducer (i.e., pi=$\lambda i$). In the case where the interdigital transducer and the reflector are formed with the same material and the same thickness, the wavelength $\lambda i$ is equal to the wavelength $\lambda r$ of the surface acoustic wave propagating to the reflector (i.e., $\lambda i=\lambda r$). Therefore, in the case where the interdigital transducer and the reflector are formed with the same structure, such as an Al thin film, the period pi of the interdigital transducer and the period pr of the reflector have the relationship, pi=2×pr.

Furthermore, a distance L between the center position A in the propagation direction of the surface acoustic wave of the grating electrode 3-4 that is the nearest to the interdigital transducer among the grating electrodes constituting the reflector and the part B corresponding to the center position of the width in the propagation direction of the surface acoustic wave of the electrode finger 2-4 that is the nearest to the reflector among the electrode fingers constituting the interdigital transducer, assuming that the electrode finger 2-4 is a single electrode finger, is $\lambda i/2$ where $\lambda i$ represents the wavelength of the surface acoustic wave thus excited. Because the period pi of the interdigital transducer is designed to be equal to the wavelength $\lambda i$ of the surface acoustic wave thus excited, $\lambda i$=pi, and therefore L=pi/2.

In FIG. 1, the width of the grating electrode 3-4 of the reflectors 3-1 and 3-2 is pi/4, and the width of the electrode fingers 2-4, 2-5, 2-6 and 2-7 of the interdigital transducer 2 is pi/6. In the interdigital transducer 2, parts corresponding to a half of each of the two electrode fingers 2-5 and 2-6 extending upward from the lower electrode terminal part and the two electrode fingers 2-4 and 2-7 extending downward from the upper electrode terminal part are present within the period pi, and as a result, parts corresponding to three electrode fingers are present within the period pi of the interdigital transducer 2.

FIG. 1 also shows, in the lower part thereof, a conventional interdigital transducer 2 comprising single electrode fingers shown in FIG. 17 for comparison. The electrode fingers expressed by broken lines in the upper part of FIG. 1 correspond to the conventional single electrode fingers 2-3 and 2-3' shown in the lower part of the figure.

EXAMPLE 2

Figure 2:
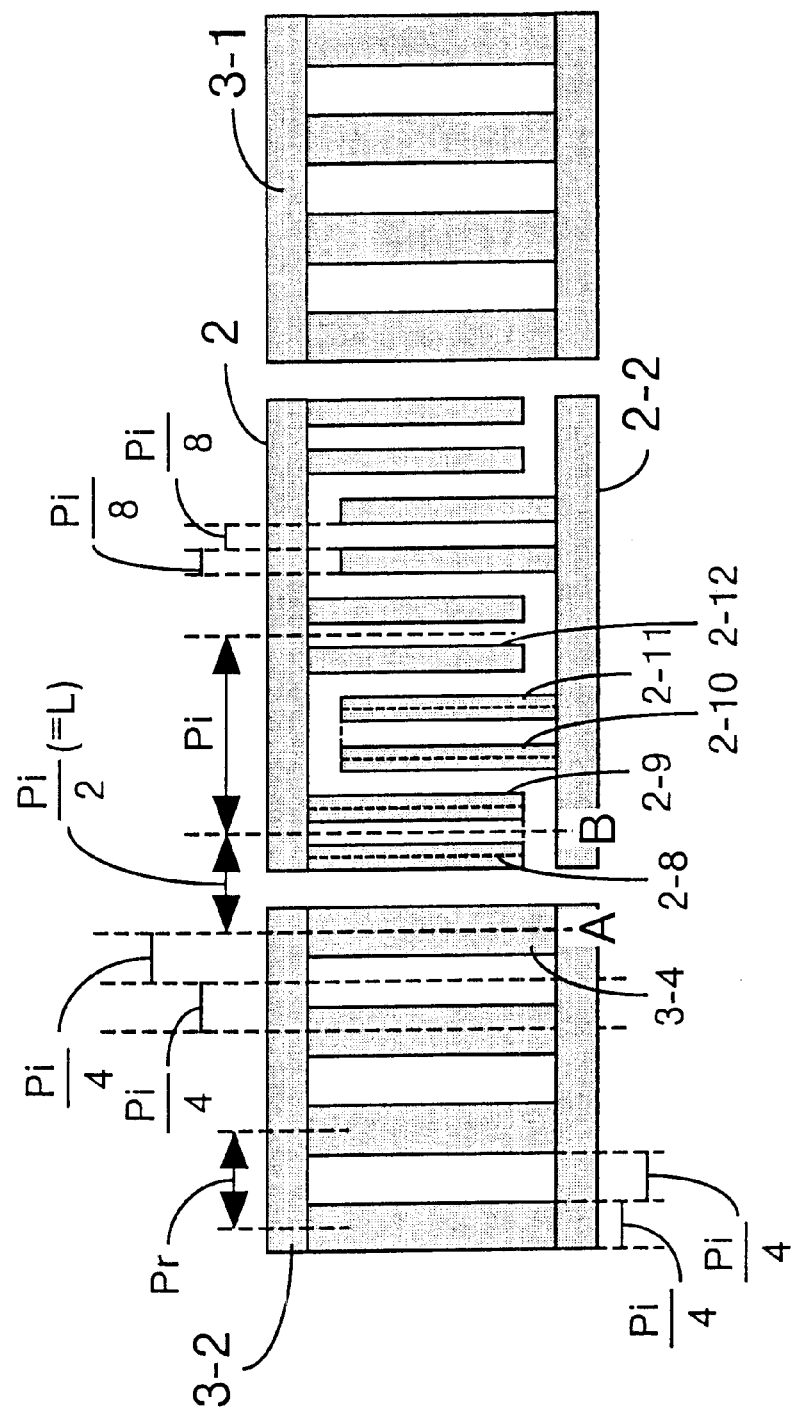
FIG. 2 is a constitutional diagram showing another example of a single terminal pair surface acoustic wave resonator according to the invention.

FIG. 2 is a constitutional diagram showing another example of a single terminal pair resonator according to the invention that has four electrode fingers within the period pi of the interdigital transducer. In this example, the period pr of the grating electrodes of the reflector is made equal to a half of the wavelength $\lambda r$ of the surface acoustic wave propagating to the reflector (i.e., pr=$\lambda r/2$).

In the case where the interdigital transducer and the reflector are formed with the same structure of, for example an Al thin film, the period pi of the interdigital transducer and the period pr of the reflector have the relationship, pi=2×pr.

Furthermore, a distance L between the center position A in the propagation direction of the surface acoustic wave of the grating electrode 3-4 that is the nearest to the interdigital transducer among the grating electrodes constituting the reflector 3-2 and the part B corresponding to the center position of in the propagation direction of the surface acoustic wave of the electrode finger 2-8 that is the nearest to the reflector 3-2 among the electrode fingers constituting the interdigital transducer 2, assuming that the electrode finger 2-8 is a single electrode finger, is, for the wavelength $\lambda$ in the propagation direction of the surface acoustic wave, $\lambda/2$ (where $\lambda$=pi).

In FIG. 2, the width of the grating electrode 3-4 of the reflectors 3-1 and 3-2 is pi/4, and the width of the electrode fingers 2-8, 2-9, 2-10, 2-11 and 2-12 of the interdigital transducer 2 is pi/8. In the interdigital transducer, four electrode fingers (2-9, 2-10, 2-11 and 2-12) are present within the period pi.

In this example, the center position B assuming the electrode finger as a single electrode finger agrees with the center position in the propagation direction of the surface acoustic wave of the two adjacent electrode fingers 2-8 and 2-9. That is, in this example, assuming that the adjacent two electrode fingers 2-8 and 2-9 nearest to the reflector 3-2 are replaced by one electrode finger having the same width as the width of such a region that is occupied by the two electrode fingers, the center position of the width in the propagation direction of the surface acoustic wave of the one electrode finger agrees with the center position in the propagation direction of the surface acoustic wave of the adjacent two electrode fingers 2-8 and 2-9.

In FIG. 2, the broken lines drawn over the electrode fingers 2-8 and 2-9 show the position corresponding to the electrode finger 2-3 of the conventional example shown in FIG. 1, and the broken lines drawn over the electrode fingers 2-10 and 2-11 show the position corresponding to the electrode finger 2-3' of the conventional example shown in FIG. 1.

The distances of the grating electrodes of the reflectors 3-1 and 3-2 are pi/4, and the distances of the electrode fingers of the interdigital transducer 2 are pi/8.

In the case where the electrode fingers of the interdigital transducer and the grating electrodes of the reflector are formed with thin films of different materials, or with the same material but having different thickness, the velocity vi of the surface acoustic wave excited by the interdigital transducer is slightly different from the velocity vr of the surface acoustic wave propagating to the reflector (i.e., vi≠vr).

That is, the wavelength $\lambda i$ of the surface acoustic wave excited by the interdigital transducer is slightly different from the wavelength $\lambda r$ of the surface acoustic wave propagating to the reflector. This is because since it is general that v=f$\lambda$, and vi≠vr, $\lambda i$≠$\lambda r$ when f is constant. Therefore, since $\lambda r$=2×pr in the invention, the period pi of the interdigital transducer, which is equal to the wavelength $\lambda i$ of the surface acoustic wave excited by the interdigital transducer, does not agree with twice the period pr of the grating electrodes in the case where the materials are different from each other or the like cases, and the values are slightly different from each other (i.e., pi=$\lambda$i≠$\lambda$r=2×pr).

For example, in the case where a interdigital transducer of an Al thin film having a period pi of 4.6 $\mu$m and a thickness of 300 nm is formed on a 42° Y-cut X-propagation LT substrate, the resonance frequency f of the serial resonator is 819.5 MHz. At this time, since vi =f×pi, the velocity vi of the surface acoustic wave excited by the electrode fingers of the interdigital transducer is 3,769.7 m/s.

On the other hand, in the case where the grating electrodes of the reflector is formed with the Al thin film, which is the same material as the interdigital transducer, but having a thickness of 230 nm, which is different from the interdigital transducer, the velocity vr of the surface acoustic wave propagating to the reflector inside the reflector is 3,808.8 m/s. Therefore, vi≠vr.

The period pi is equal to the wavelength $\lambda$i of the surface acoustic wave thus excited. That is, pi=$\lambda$i=vr/f (=4.6). On the other hand, since vr=f×$\lambda$r, the wavelength $\lambda$r of the surface acoustic wave inside the reflector is about 4.6477 $\mu$m, which is different from the wavelength $\lambda$i ($\lambda$r≠$\lambda$i).

One of the characteristic features of the invention resides in that the period pr of the grating electrodes of the reflector is a half of the wavelength $\lambda$r of the surface acoustic wave propagating in the reflector, and since the period pr is $\lambda$r/2, the period pr may be about 2.3239 $\mu$m. Therefore, in the case where the thickness of the electrodes of the interdigital transducer and the thickness of the electrodes of the reflector are different from each other, there are cases where the relationship, pi=2×pr, is not achieved.

EXAMPLE 3

Figure 3:
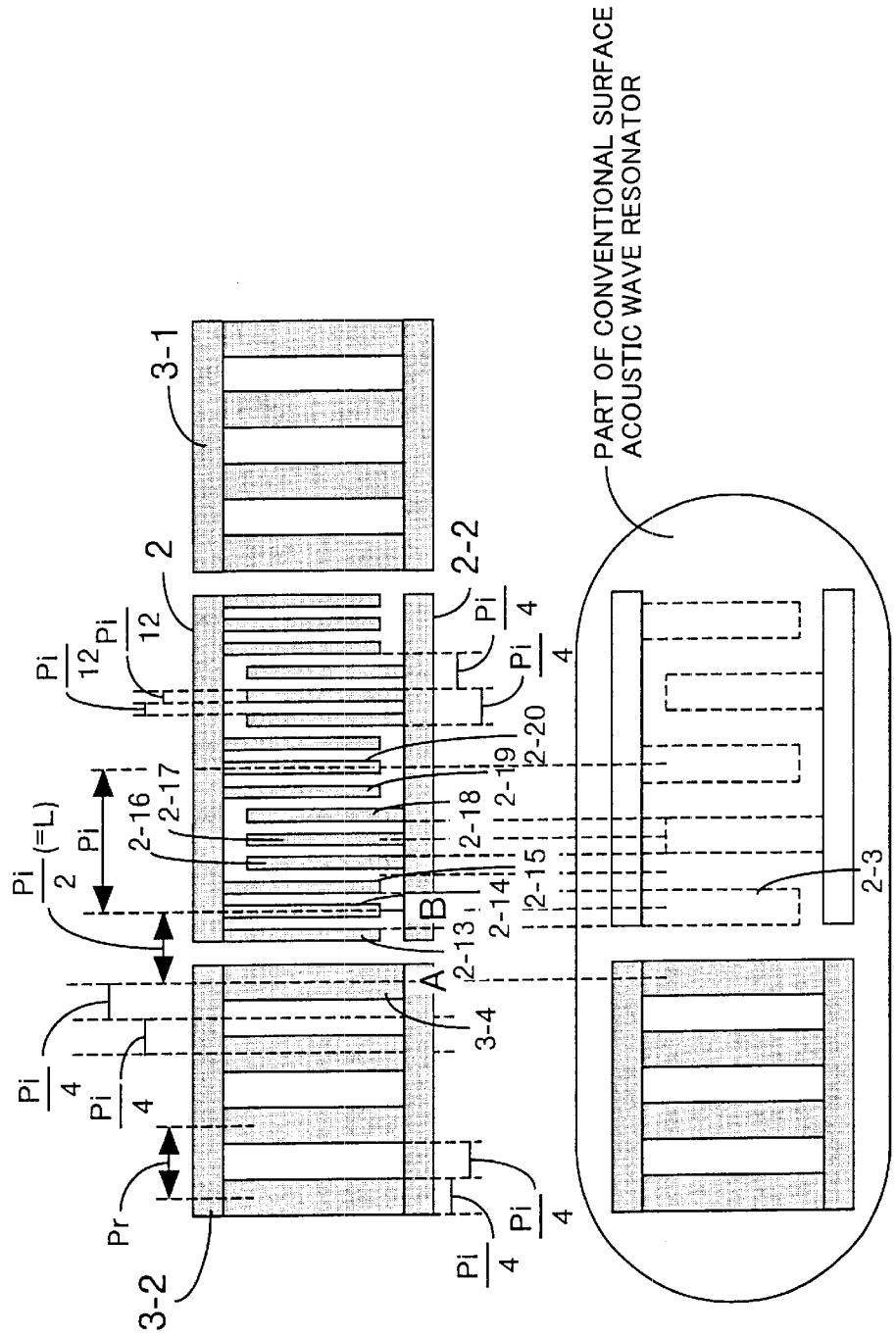
FIG. 3 is a constitutional diagram showing a further example of a single terminal pair surface acoustic wave resonator according to the invention.

FIG. 3 is a constitutional diagram showing a further example of a single terminal pair resonator according to the invention that has six electrode fingers within the period pi of the interdigital transducer.

The period pi of the interdigital transducer and the period pr of the reflector have the relationship, pi=2×pr, in the case where the interdigital transducer and the reflector are formed with the same structure, such as an Al thin film. The distance L between the center position A in the propagation direction of the surface acoustic wave of the grating electrode 3-4 that is the nearest to the interdigital transducer among the grating electrodes constituting the reflector 3-2 and the part B corresponding to the center position in the propagation direction of the surface acoustic wave of the electrode fingers (2-13, 2-14 and 2-15) that are the nearest to the reflector 3-2 among the electrode fingers constituting the interdigital transducer 2, assuming that the electrode fingers (2-13, 2-14 and 2-15) are single electrode fingers, is $\lambda$/2 where $\lambda$ represents the wavelength of the propagating surface acoustic wave ($\lambda$=pi herein).

In FIG. 3, the width of the grating electrode 3-4 of the reflectors 3-1 and 3-2 is pi/4, and the width of the electrode fingers (from 2-13 to 2-20) of the interdigital transducer 2 is pi/12. The distances of the grating electrodes of the reflectors 3-1 and 3-2 are pi/4, and the distances of the electrode fingers of the interdigital transducer 2 are pi/12. The center position B assuming that the electrode fingers are single electrodes agrees with the center position in the propagation direction of the adjacent three electrode fingers 2-13, 2-14 and 2-15, and as a result, agrees with the center position of the electrode finger 2-14.

Assuming that the adjacent three electrode fingers 2-13, 2-14 and 2-5 nearest to the reflector are replaced by one electrode finger having the same width as the width of such a region that is occupied by the three electrode fingers, the center position B agrees with the center position of the width in the propagation direction of the surface acoustic wave of the one electrode finger.

In the interdigital transducer 2, five electrode fingers 2-15, 2-16, 2-17, 2-18 and 2-19 and a half of each of the electrode fingers 2-14 and 2-20 are present in the period pi, and thus six electrode fingers in total are present therein.

As shown in the lower part of FIG. 3, the center position of the electrode finger 2-3 of the conventional example agrees with the center position of the electrode finger 2-14.

The three examples have been described with reference to the constitutional diagrams as in FIGS. 1 to 3, and by using such constitutions, such a ladder type filter can be obtained that has characteristics of a higher shape factor than the conventional one while it has the same band width as the conventional ladder type filter by approximating the resonance frequency and the antiresonance frequency of the surface acoustic wave resonator.

SPECIFIC DESIGN EXAMPLES OF THE INVENTION

Specific design examples and characteristic diagrams thereof of the surface acoustic wave resonator of the invention will be described below to make clear that the effect of the invention is exhibited.

In the invention, it is sufficient that three or more electrode fingers (n≧3) within the period pi of the interdigital transducer, but the invention is not limited to the number of electrode fingers n=3, 4 and 6 as described in the foregoing.

Figure 4:
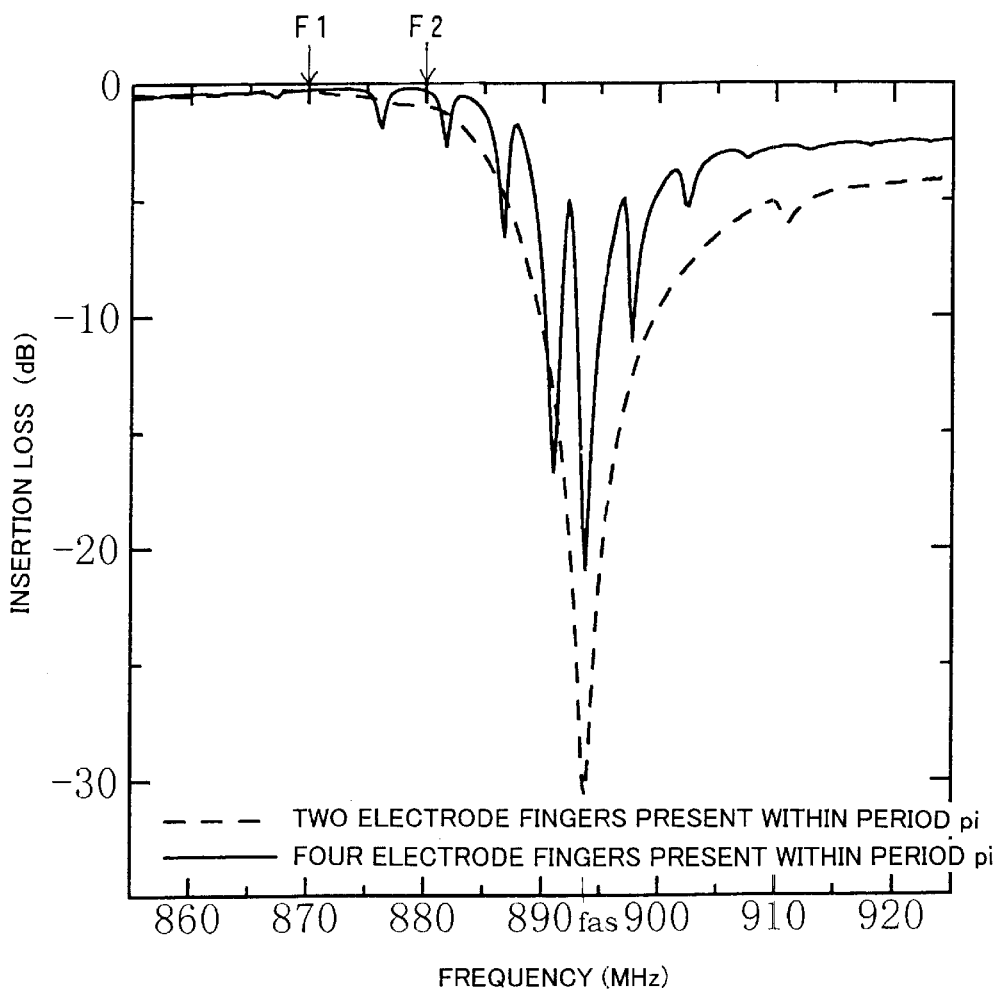
FIG. 4 is a comparative diagram showing frequency characteristics of a surface acoustic wave resonator connected in serial.
Figure 20B:
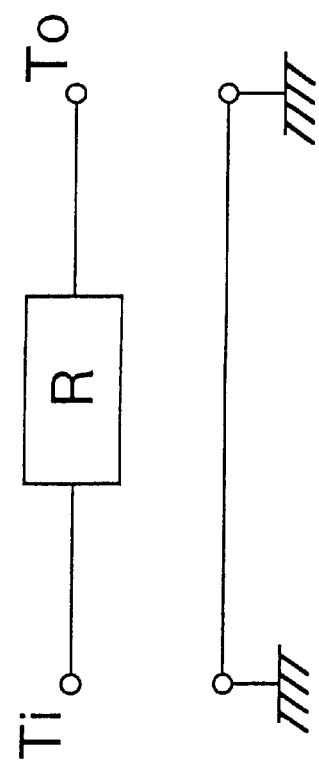
FIGS. 20(*a*) and 20(*b*) are a constitutional diagram and a diagram showing an equivalent circuit of a conventional single terminal pair surface acoustic wave resonator connected in serial.
Figure 20A:
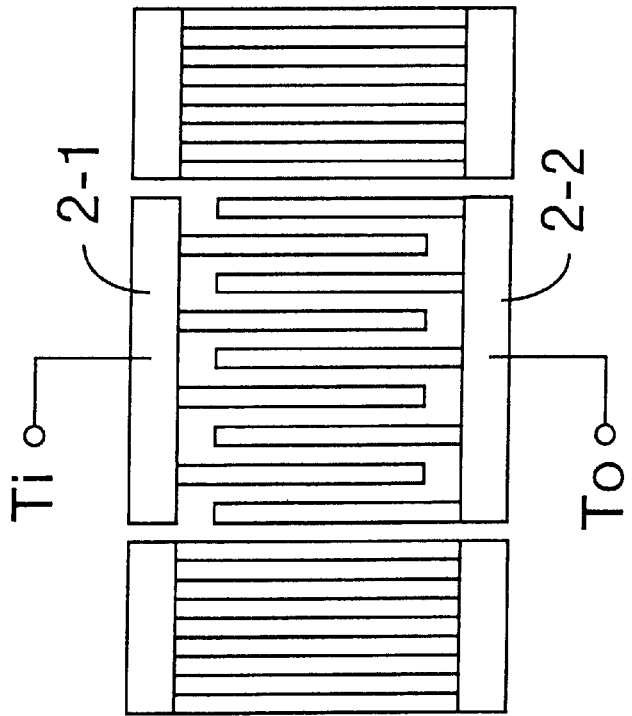
Figure 21B:
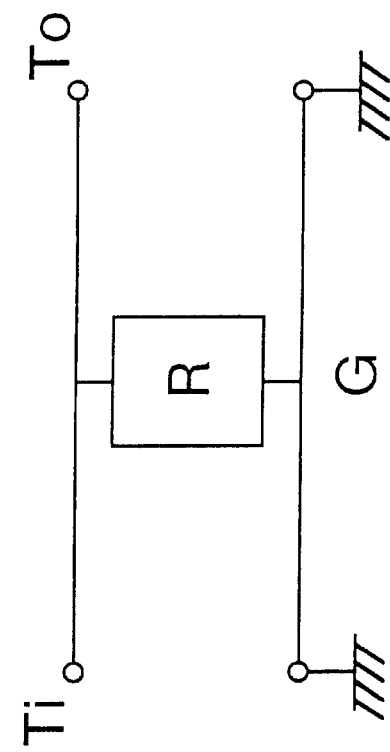
FIGS. 21(*a*) and 21(*b*) are a constitutional diagram and a diagram showing an equivalent circuit of a conventional single terminal pair surface acoustic wave resonator connected in parallel.
Figure 21A:
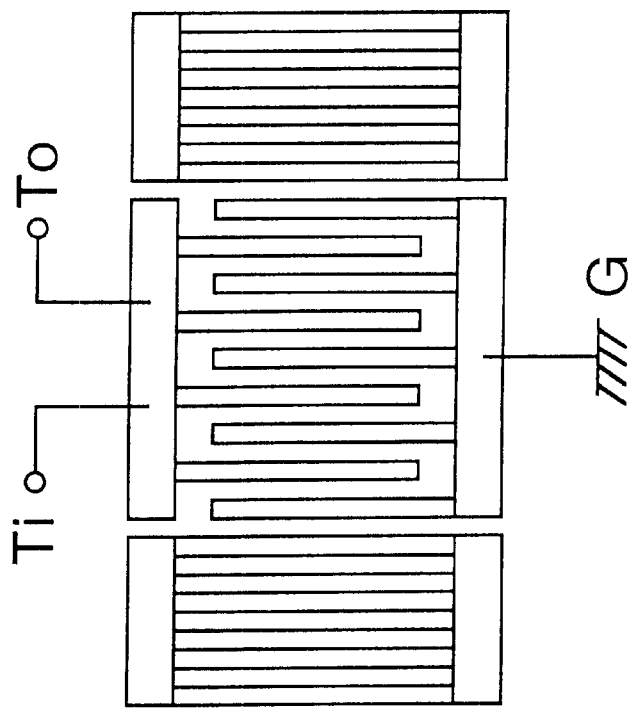
Figure 22:
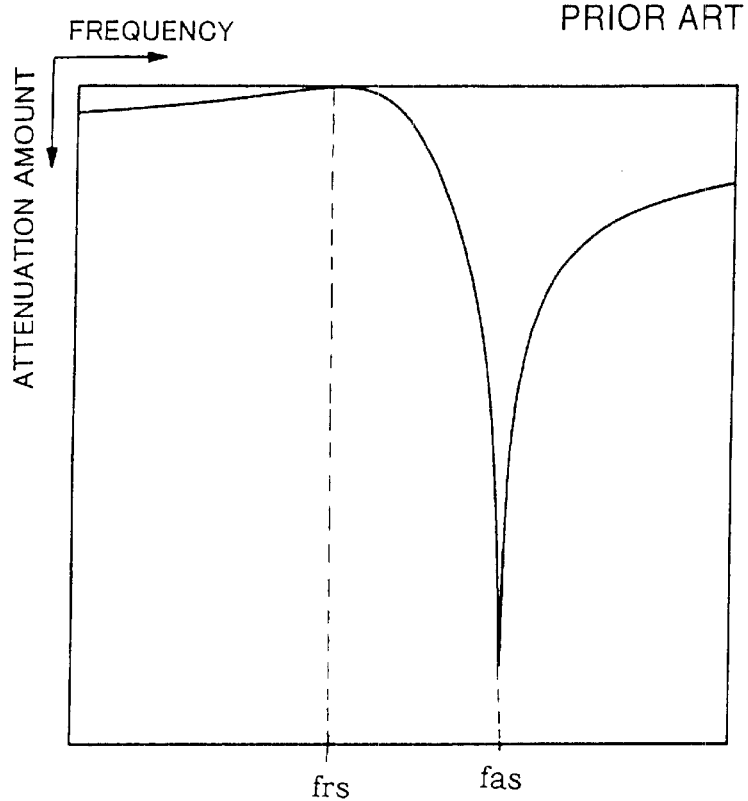
FIG. 22 is a diagram showing frequency characteristics in the case where a conventional single terminal pair surface acoustic wave resonator is connected in serial.
Figure 23:
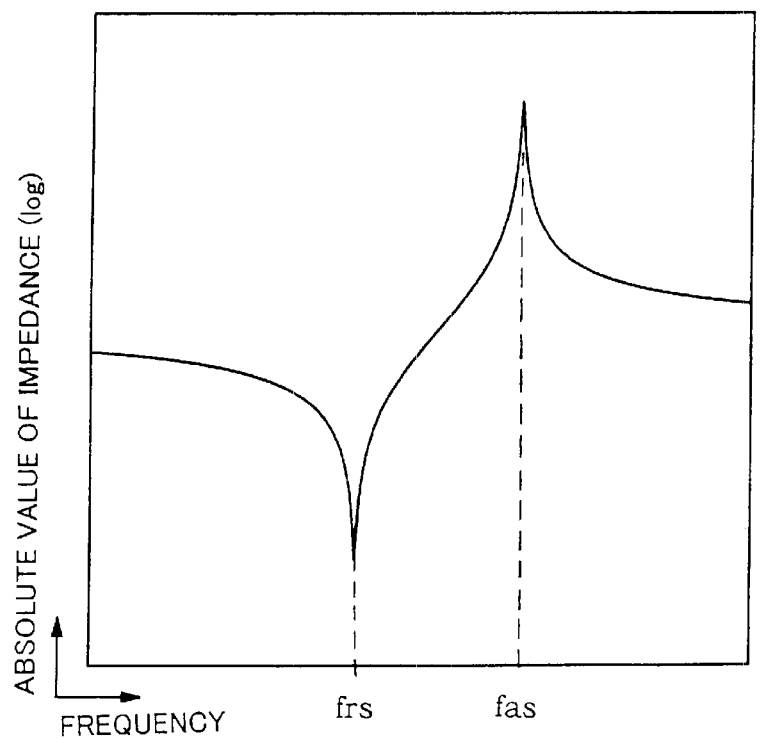
FIG. 23 is a diagram showing impedance characteristics in the case where a conventional single terminal pair surface acoustic wave resonator is connected in serial.
Figure 24:
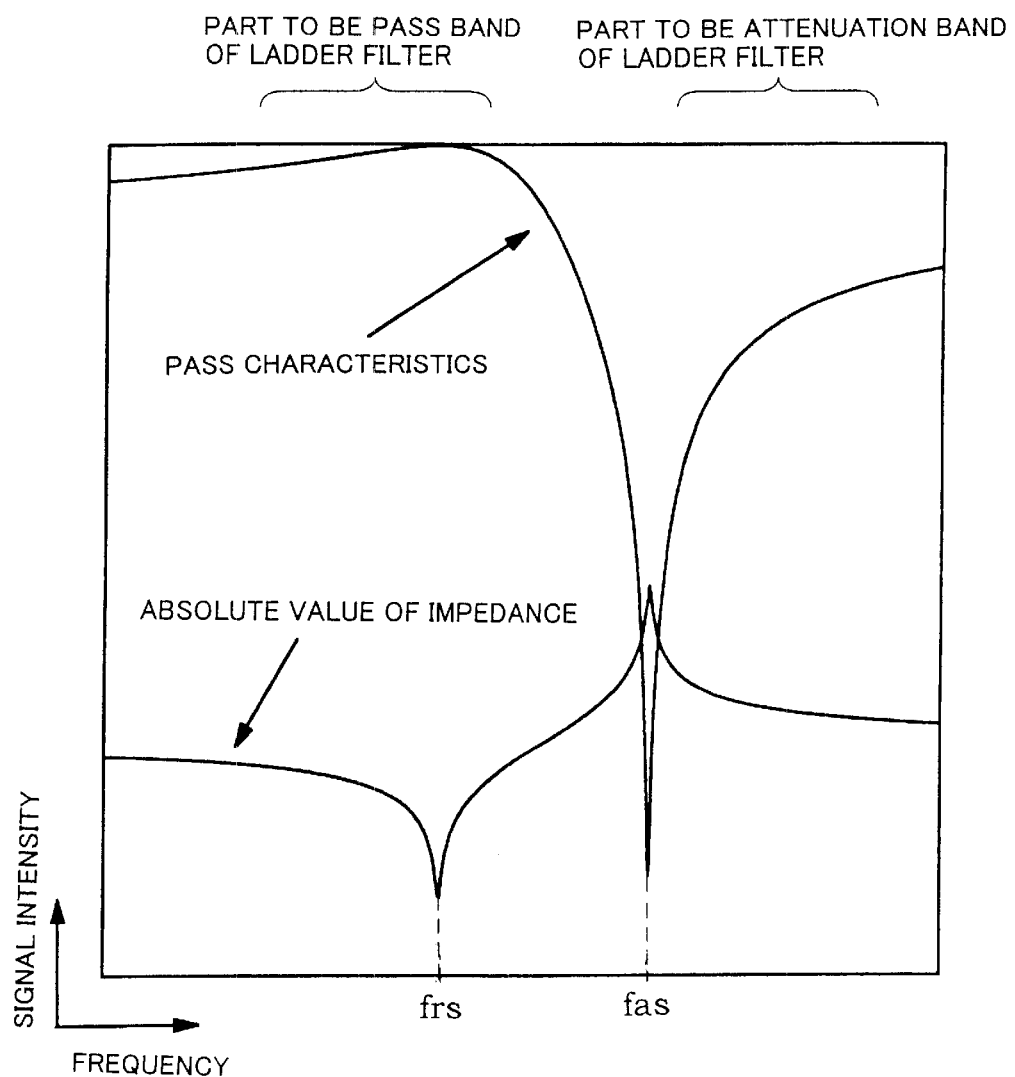
FIG. 24 is a diagram showing the pass band and the attenuation band of a conventional ladder type filter.
Figure 25:
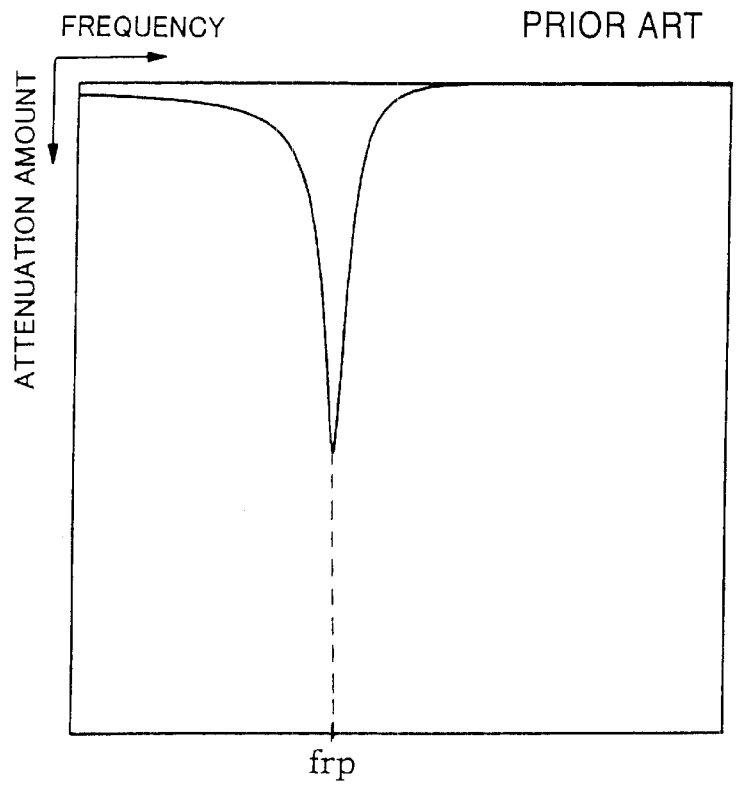
FIG. 25 is a diagram showing frequency characteristics in the case where a conventional single terminal pair surface acoustic wave resonator is connected in parallel.
Figure 26:
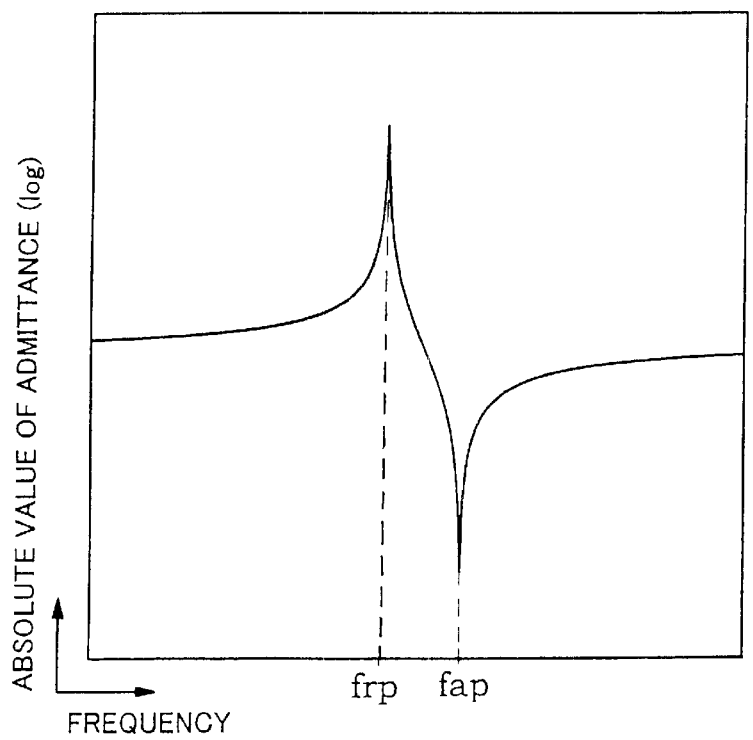
FIG. 26 is a diagram showing impedance characteristics in the case where a conventional single terminal pair surface acoustic wave resonator is connected in parallel.

FIG. 4 is a diagram showing frequency characteristics in the case where the surface acoustic wave resonators are connected in serial (see FIG. 20).

In FIG. 4, the solid line is a characteristic diagram of the case of the invention where four electrode fingers are provided within the period pi as in FIG. 2, and the broken line is a characteristic diagram of the conventional case where two electrode fingers are provided within the period pi as in FIG. 17.

Herein, an LiTaO$_3$ substrate corresponding to 36° Y-cut X-propagation is used as the piezoelectric substrate. The electrode film of the interdigital transducer is an Al—Cu alloy having a thickness of 340 nm, and the period pi of the interdigital transducer pi is 4.6 $\mu$m where the number of electrode fingers within the period pi is two, or 4.656 $\mu$m where the number of the electrode fingers within the period pi is four. The period pr of the grating reflector is 2.3 $\mu$m where the number of electrode fingers within the period pi is two, or 2.328 $\mu$m where the number of the electrode fingers within the period pi is four, and the grating reflector is formed with the Al—Cu alloy having the same thickness as the interdigital transducer.

The distance L between the center position A in the propagation direction of the grating electrode that is the nearest to the interdigital transducer among the grating electrodes constituting the reflector and the position B corresponding to the center in the propagation direction of the electrode finger that is the nearest to the reflector among the electrode fingers constituting the interdigital transducer, assuming that the electrode finger is a single electrode finger, is pi/2 in both cases.

In FIG. 4, the characteristic diagram of the case where the number of the electrode fingers within the period pi is two is shifted to the high frequency side by 50.3 MHz to align the antiresonance frequencies fas of both the characteristic diagrams of the solid line and the broken line for convenience of comparison.

In FIG. 4, the resonance frequency frs (F2 in the figure) of the invention shown by the solid line is 880.73 MHz. While the resonance frequency frs (F1 in the figure) of the conventional one shown by the broken line is 819.43 MHz, it is shown as 869.73 in FIG. 4 due to the shift by 50.3 MHz.

It is understood from the figure that in the case where the number of the electrode fingers within the period pi is four, the excitation efficiency of the interdigital transducer is dropped, and the resonance frequency frs and the antiresonance frequency fas are approximated to each other, whereby the downturn of the insertion loss is steeper than the case where the number of the electrode fingers within the period pi is two, i.e., the shape factor is large.

However, in the case where the resonator having the characteristics shown in FIG. 4 is used as it is in a ladder type filter, it is not preferred from the standpoint of band characteristics since ripple appears in the part to be the band.

In this case, the ripple disappears when the distance L between the position A and the position B shown in FIG. 1 and the like (hereinafter referred to as a comb form reflector distance or an A–B distance) is $(n/2+3/8)\lambda$ where $\lambda$ is the wavelength of the propagating surface acoustic wave, and n is 0 or a positive integer. This is because the side curve by the interdigital transducer substantially agrees with the pole of the side robe of resonance by the reflector. The ripple also disappears when $L=(n/2+5/16)\lambda$ where n is 0 or a positive integer.

Figure 5:
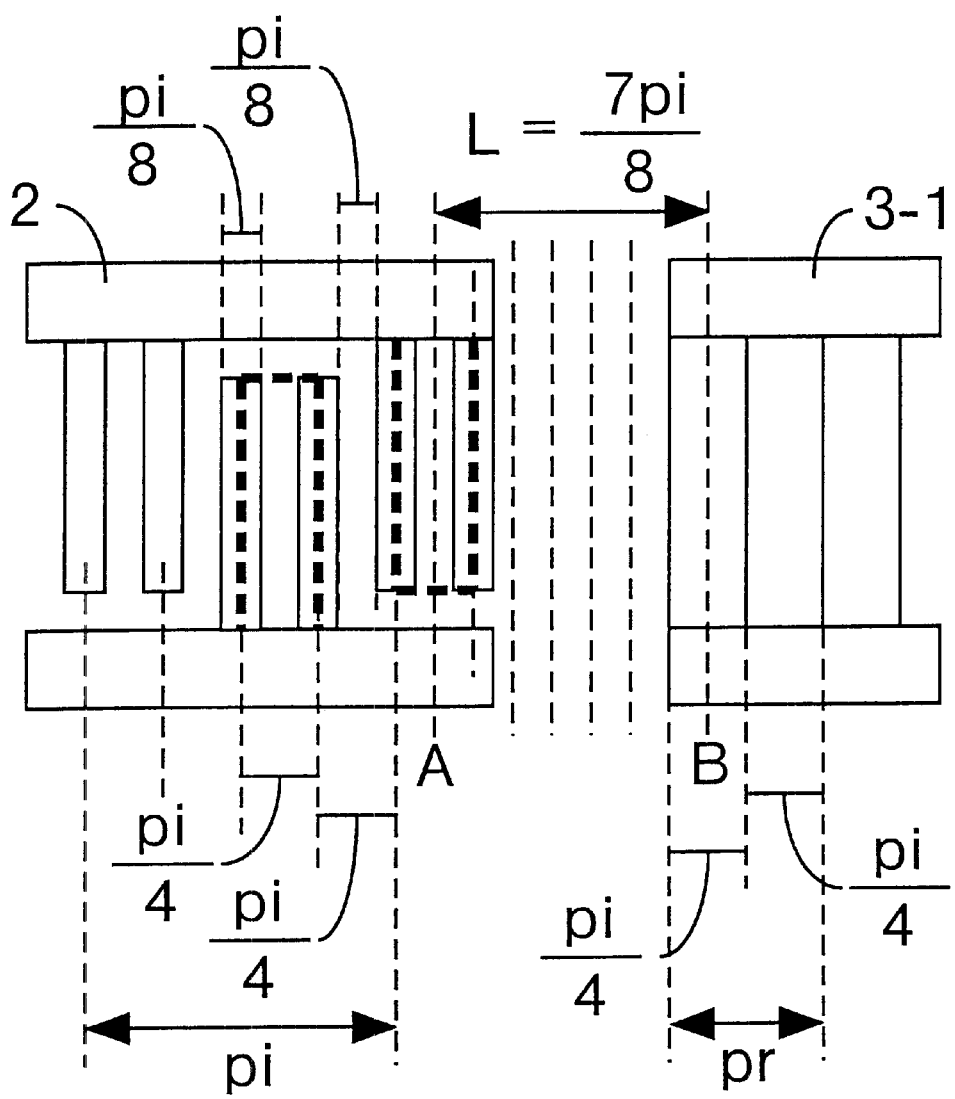
FIG. 5 is a partial constitutional diagram for explaining the positional relationship of the interdigital transducer and the reflector.

FIG. 5 is a partial constitutional diagram for explaining the positional relationship of the interdigital transducer and the reflector where n=1 in the surface acoustic wave resonator according to the invention.

The A–B distance L is (7/8)pi. The width of the electrode fingers of the interdigital transducer and the distances thereof are pi/8, and the width of the electrode fingers of the reflector and the distances thereof are pi/4 (=pr/2). The broken line in the figure indicates the position of the electrode fingers in the case of the conventional single electrode as described in the foregoing.

Figure 6:
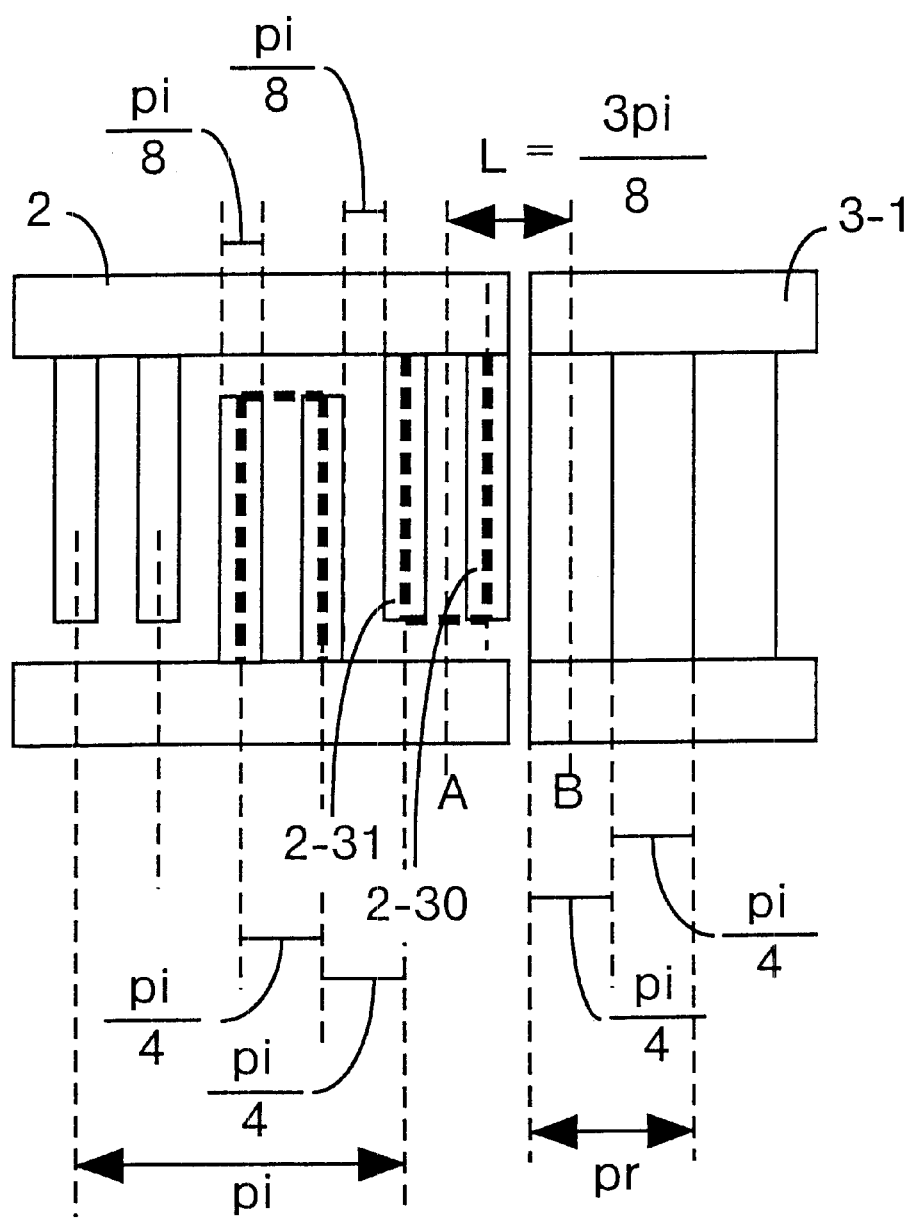
FIG. 6 is a partial constitutional diagram for explaining the positional relationship of the interdigital transducer and the reflector.

FIG. 6 is a partial constitutional diagram for explaining the positional relationship of the interdigital transducer and the reflector where n=0 according to the invention. Herein, the A–B distance L is (3/8)pi.

In general, the outermost electrode finger 2-30 of the interdigital transducer does not concern excitation of the surface acoustic wave, and thus there is no influence on the band characteristics when it is removed. In the constitutional diagram shown in FIG. 7, the electrode finger 2-30 is removed to make the electrode finger 2-31 as the outermost one.

Figure 7:
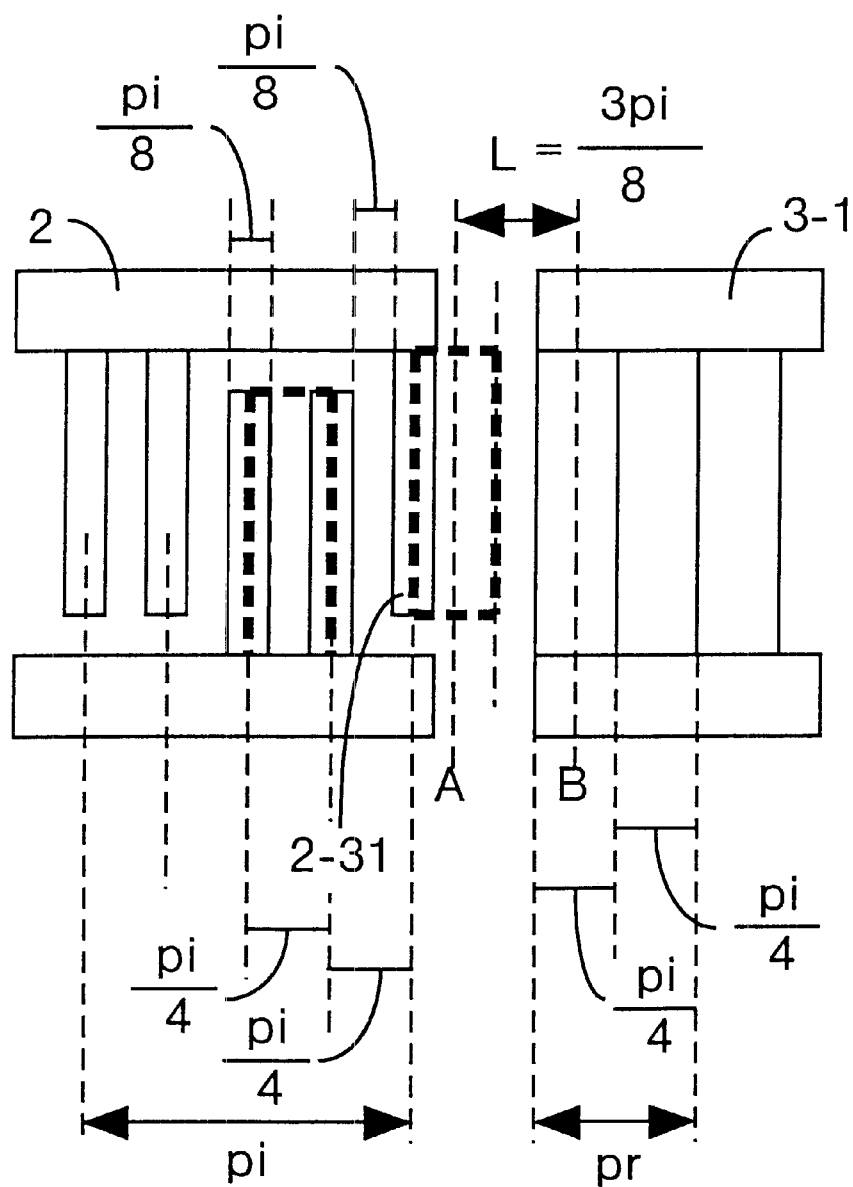
FIG. 7 is a partial constitutional diagram for explaining the positional relationship of the interdigital transducer and the reflector.

Therefore, even when the outermost electrode finger 2-30 of the interdigital transducer is removed as in FIG. 7, the steep band characteristics without ripple can be obtained as similar to FIG. 5 and FIG. 6. In the cases of FIG. 6 and FIG. 7, the width of the entire resonator can be made small since the A–B distance L is smaller than that in FIG. 5.

Figure 8:
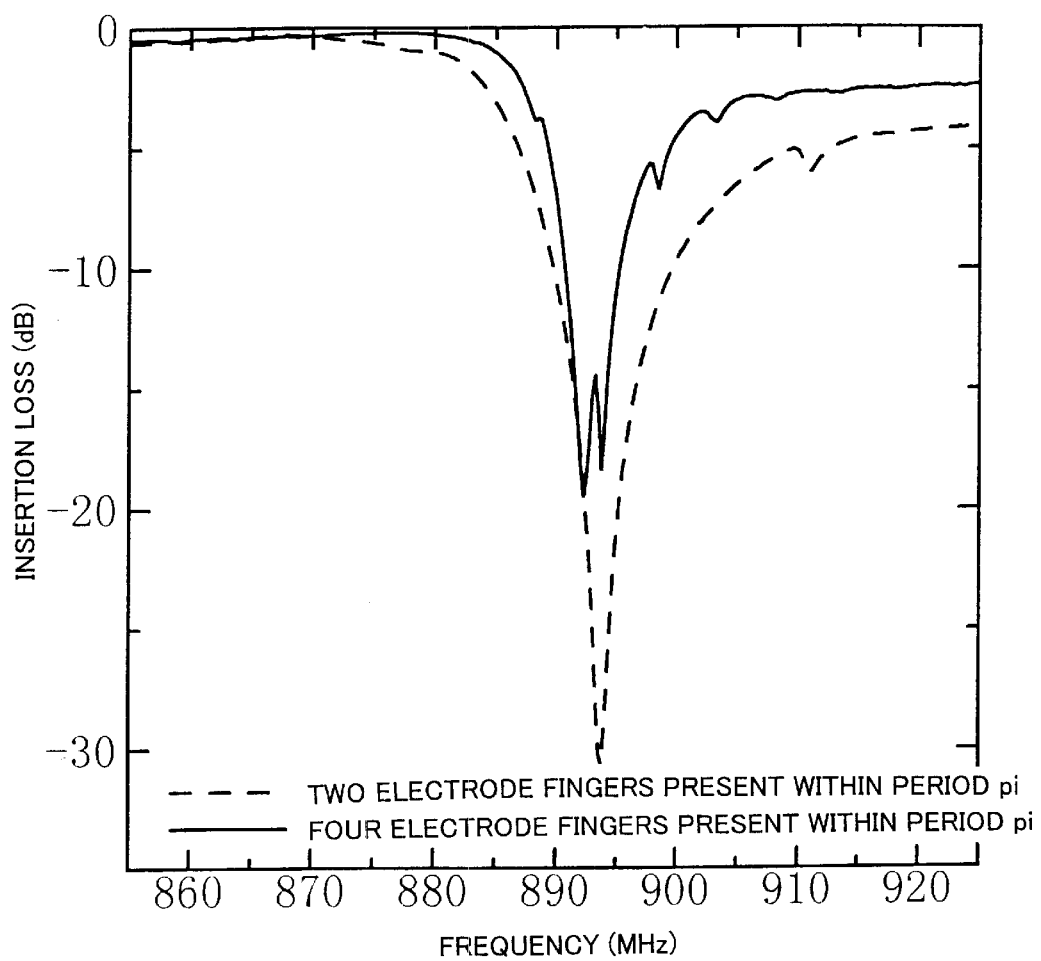
FIG. 8 is a diagram showing frequency characteristics of the surface acoustic wave resonator according to the invention connected in serial.

FIG. 8 is a diagram showing frequency characteristics of a surface acoustic wave resonator of serial connection where the A–B distance is optimized. In the figure, the diagram shown by the solid line is the case where the number of electrode fingers within the period pi of the interdigital transducer is four, and the A–B distance L is (7/8)pi as shown in FIG. 5. The diagram shown by the broken line is the case where the number of electrode fingers within the period pi of the interdigital transducer is two as similar to the conventional one.

An LiTaO$_3$ substrate corresponding to 36° Y-cut X-propagation is used as the piezoelectric substrate. The electrode film of the interdigital transducer is an Al—Cu alloy having a thickness of 340 nm, and the period pi of the interdigital transducer pi is 4.6 $\mu$m where the number of electrode fingers within the period pi is two, or 4.656$\mu$m where the number of the electrode fingers within the period pi is four. The period pr of the grating electrodes of the grating reflector is 2.3 $\mu$m where the number of electrode fingers within the period pi is two, or 2.328 $\mu$m where the number of the electrode fingers within the period pi is four, and the grating reflector is formed with the Al—Cu alloy having the same thickness as the interdigital transducer. The characteristic diagram of the case where the number of the electrode fingers within the period pi is two is shifted to the high frequency side by 50.3 MHz to align the antiresonance frequencies fas of both the characteristic diagrams for convenience of comparison.

The diagram of the solid line exhibits steeper frequency characteristics than the diagram of the conventional one of the broken line, and substantially no ripple appears as compared to FIG. 4.

Figure 9:
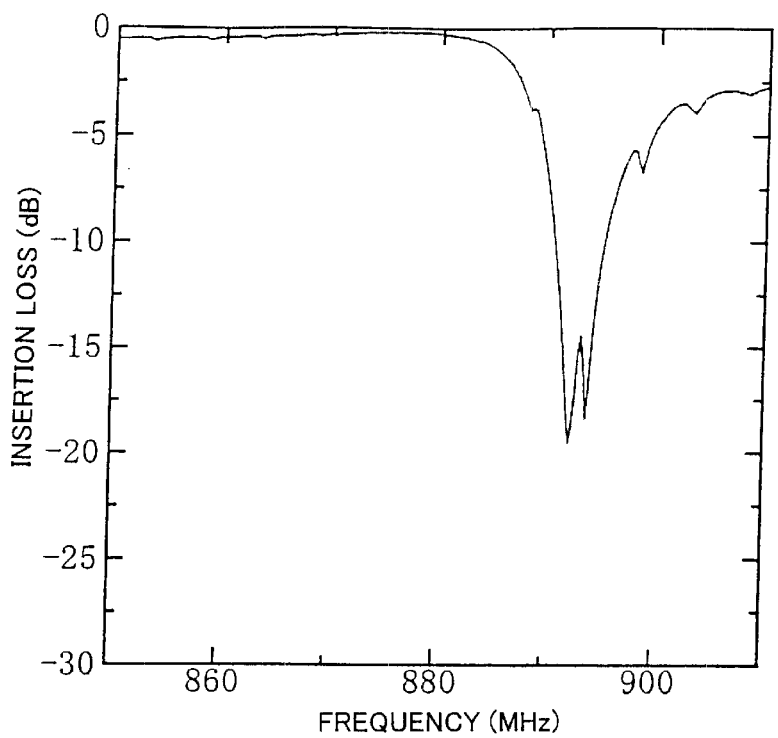
FIG. 9 is a diagram showing frequency characteristics of the surface acoustic wave resonator according to the invention connected in serial.

FIG. 9 is a diagram showing frequency characteristics of the surface acoustic wave resonator of serial connection where the A-B distance L is (9/16)pi.

Figure 10:
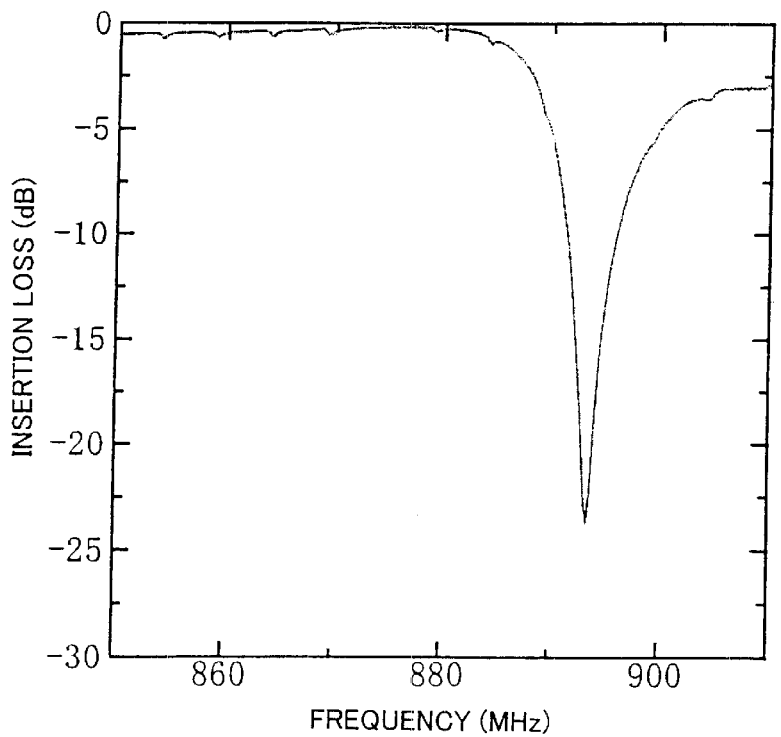
FIG. 10 is a diagram showing frequency characteristics of the surface acoustic wave resonator according to the invention connected in serial.

FIG. 10 is a diagram showing frequency characteristics of the surface acoustic wave resonator of serial connection where the A-B distance L is (5/16)pi.

According to the diagrams, steeper frequency characteristics than the conventional one are obtained in both cases. However, as comparing FIG. 9 and FIG. 10, when the resonators are connected in serial, ripple appearing around the resonance frequency frs defining the pass band of the ladder type filter is smaller in the case of FIG. 9 where the A–B distance L is (9/16)pi.

Figure 11:
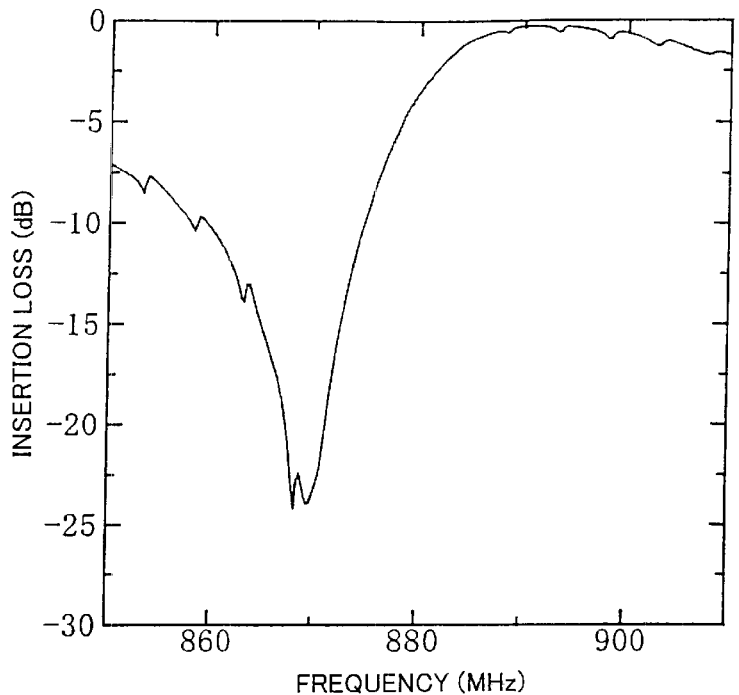
FIG. 11 is a diagram showing frequency characteristics of the surface acoustic wave resonator according to the invention connected in parallel.
Figure 12:
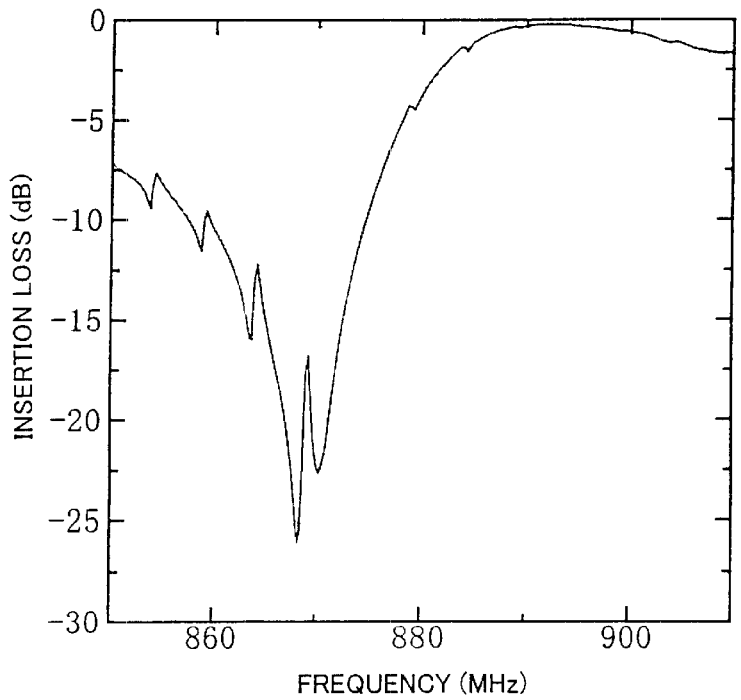
FIG. 12 is a diagram showing frequency characteristics of the surface acoustic wave resonator according to the invention connected in parallel.

FIG. 11 is a diagram showing frequency characteristics of the surface acoustic wave resonator of parallel connection where the A–B distance L is (9/16)pi, and FIG. 12 is a diagram showing frequency characteristics of the surface acoustic wave resonator of parallel connection where the A–B distance L is (5/16)pi.

As comparing FIG. 11 and FIG. 12, when the resonators are connected in parallel, ripple appearing around the resonance frequency frs defining the pass band of the ladder type filter is smaller in the case of FIG. 12 where the A-B distance L is (5/16)pi.

Figure 13:
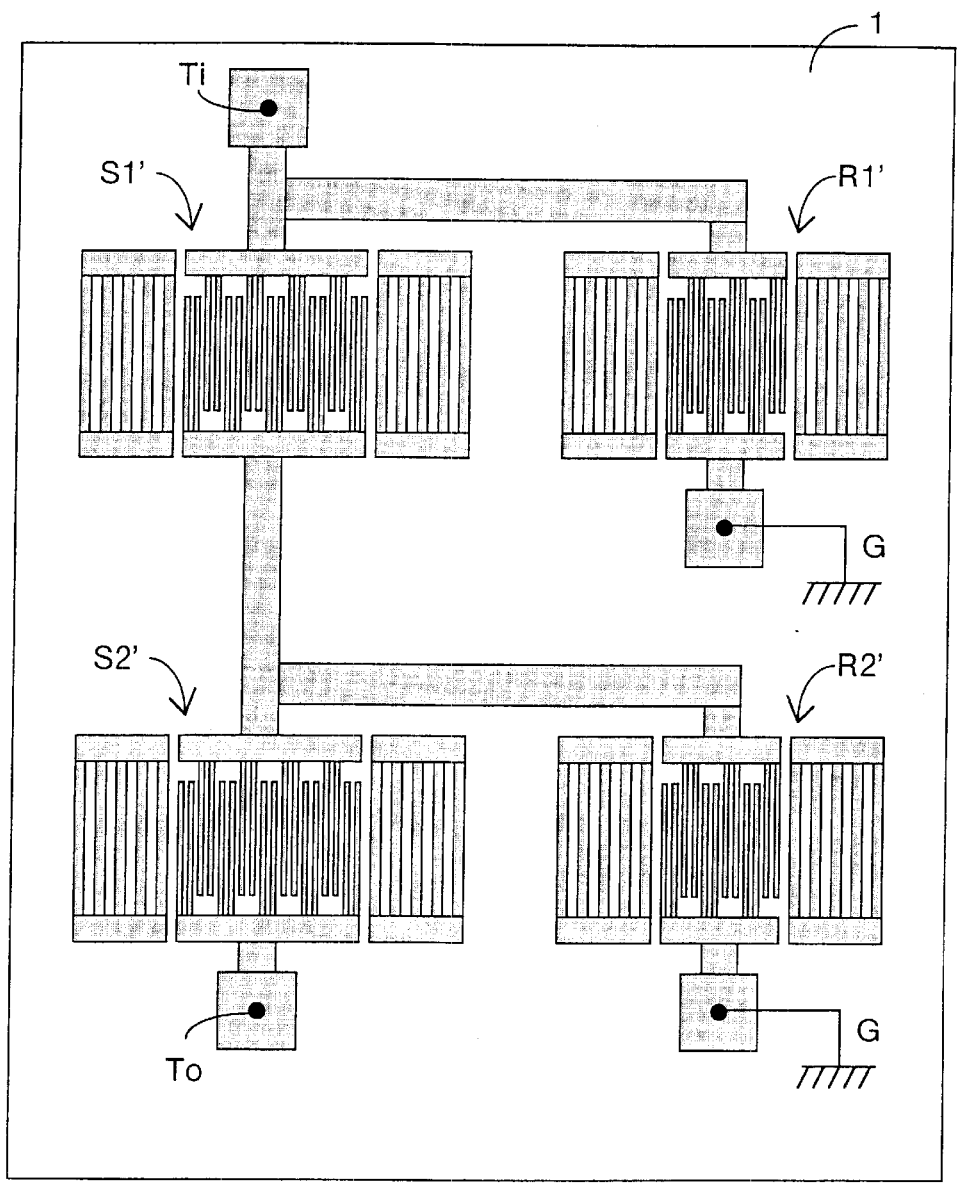
FIG. 13 is a constitutional diagram showing an example of a ladder type filter using the surface acoustic wave resonator according to the invention.

FIG. 13 is a constitutional diagram showing an example of a ladder type filter constituted by combining the single terminal pair surface acoustic wave resonators according to the invention in serial and parallel.

Figure 27:
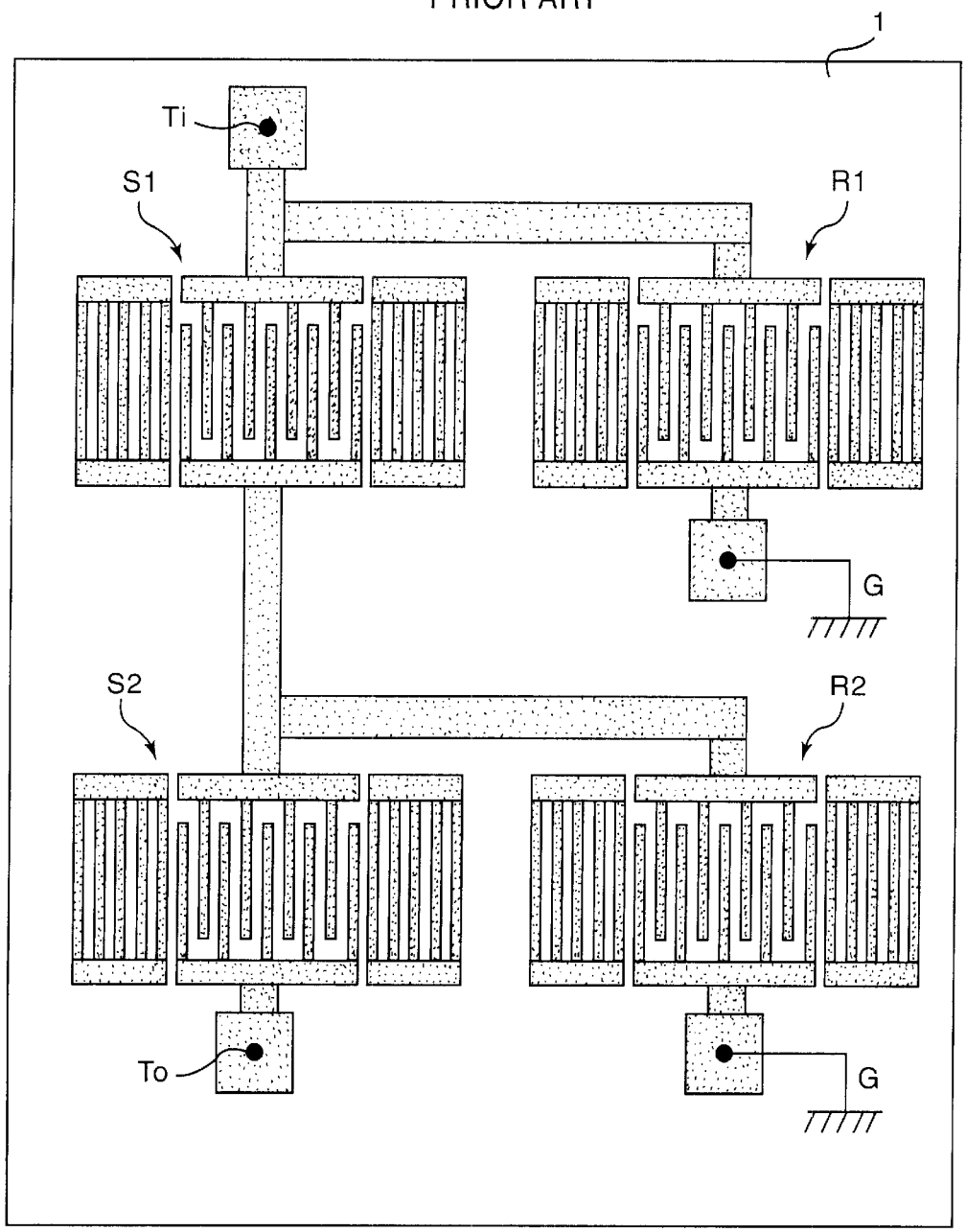
FIG. 27 is a constitutional diagram showing serial connection and parallel connection of a conventional ladder type filter.
Figure 28:
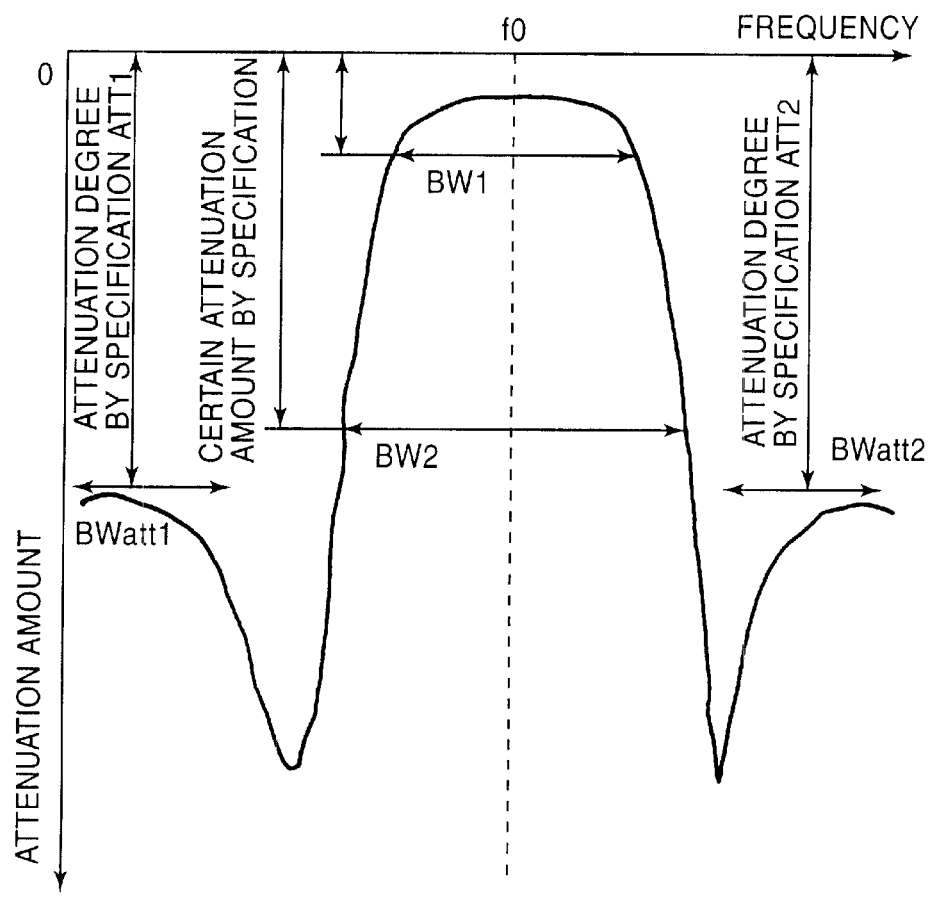
FIG. 28 is a diagram showing frequency characteristics of an ordinary ladder type filter.

FIG. 13 corresponds to the conventional constitution shown in FIG. 27, but is different therefrom in such a point that the surface acoustic wave resonators according to the invention shown in FIG. 1 or FIG. 3 are used as all the resonators Si', S2', R1' and R2'. While the case where both the numbers of the serial resonators and the parallel resonators are two is indicated, they are not limited thereto and may be three or more. Furthermore, it is sufficient that the number of pairs of the serial resonators and the parallel resonators is two or more.

An LiTaO$_3$ substrate corresponding to 42° Y-cut X-propagation is used as the piezoelectric substrate 1, and the electrode films of all the electrodes are an Al—Cu alloy having a thickness of 400 nm. FIG. 13 shows a resonator having four electrode fingers within the period pi of the interdigital transducer.

Figure 14:
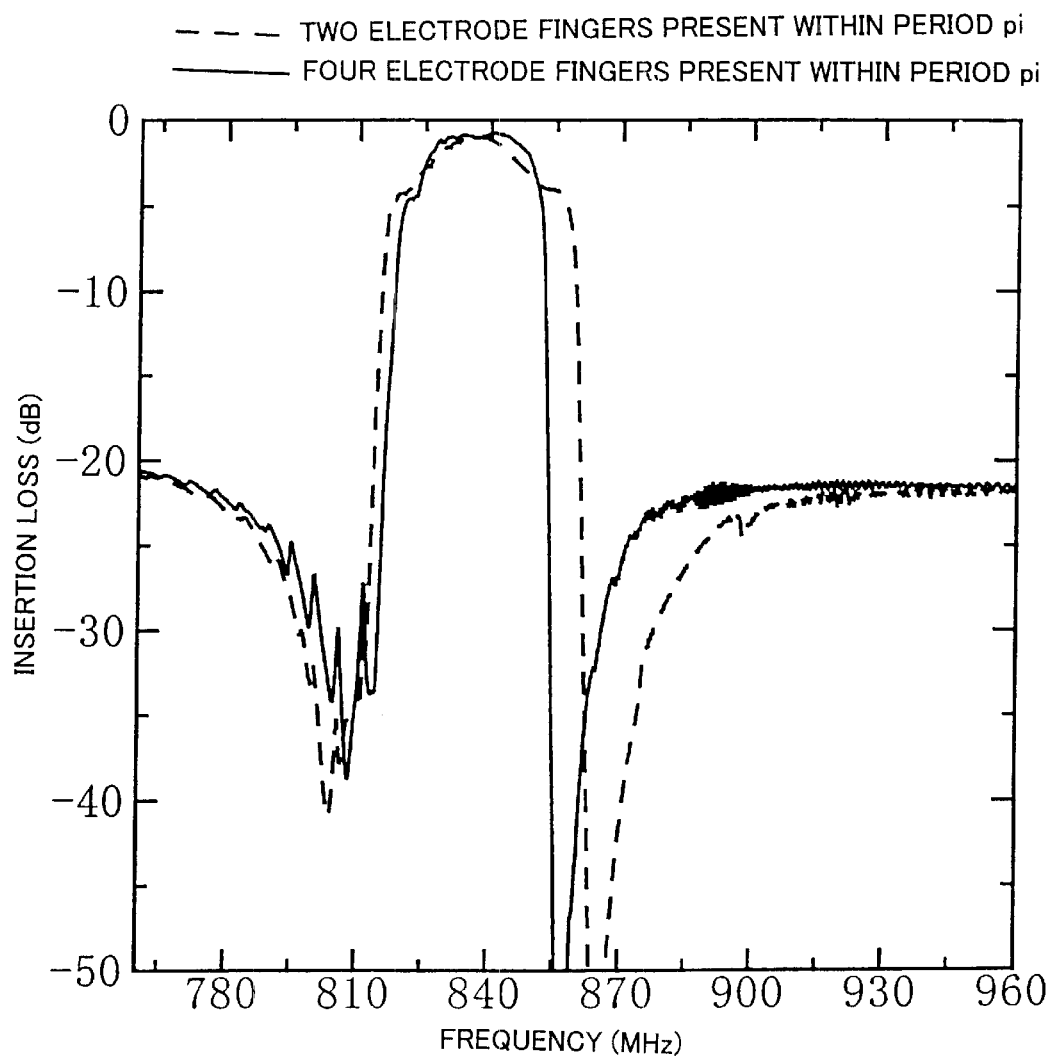
FIG. 14 is a diagram showing frequency characteristics of the ladder type filter using the surface acoustic wave resonator according to the invention.

FIG. 14 is a diagram showing frequency characteristics of the ladder type filter shown in FIG. 13. Herein, the solid line indicates the frequency characteristics of the case where the number of electrode fingers within the period pi of the interdigital transducer is four according to the invention (see FIG. 2), and the broken line indicates the frequency characteristics of the conventional case where the number of electrode fingers within the period pi is two.

Generally, in a ladder type filter, the period pis and pip of the resonators connected in serial (serial resonators) and the resonators connected in parallel (parallel resonators) are deviated to each other, whereby the antiresonance frequency fap of the parallel resonators and the resonance frequency frs of the serial resonators are aligned to each other, so as to form a pass band. The difference in period between the parallel resonators and the serial resonators is represented by Δpi=pis−pip.

FIG. 14 shows an example of a filter of an 800 MHz band that is designed in such a manner that a band width at a loss of 3 dB is from 23 to 25 MHz. In the case where the number of electrode fingers within the period pi is two, pip=4.8 $\mu$m, pis=4.68 $\mu$m, Δpi=0.12 $\mu$m, and values of a half of the respective periods of the interdigital transducer are applied to the grating reflector. In the case where the number of electrode fingers within the period pi is four, pip=4.94 $\mu$m, pis=4.82 m, Δpi=0.12 $\mu$m, and values of a half of the respective periods of the interdigital transducer are applied to the grating reflector. The A–B distance is 7pis/8 for the serial resonators and 5pip/16 for the parallel resonators.

According to the diagram shown by the solid line in FIG. 14, the band width at an insertion loss of 3 dB (3 dB band width) is 25.25 MHz. The band width at an insertion loss of 20 dB (20 dB band width) is 37.75 MHz, and the shape factorn at this time is 0.67.

According to the diagram shown by the broken line of the conventional one, the 3 dB band width is 23.25 MHz, the 20 dB band width is 47.25 MHz, and the shape factor is 0.49. It is understood from the shape factors that steeper characteristics can be obtained in the similar band width by using the resonator shown in FIG. 2 according to the invention rather than the resonator having the conventional electrode constitution.

Figure 15:
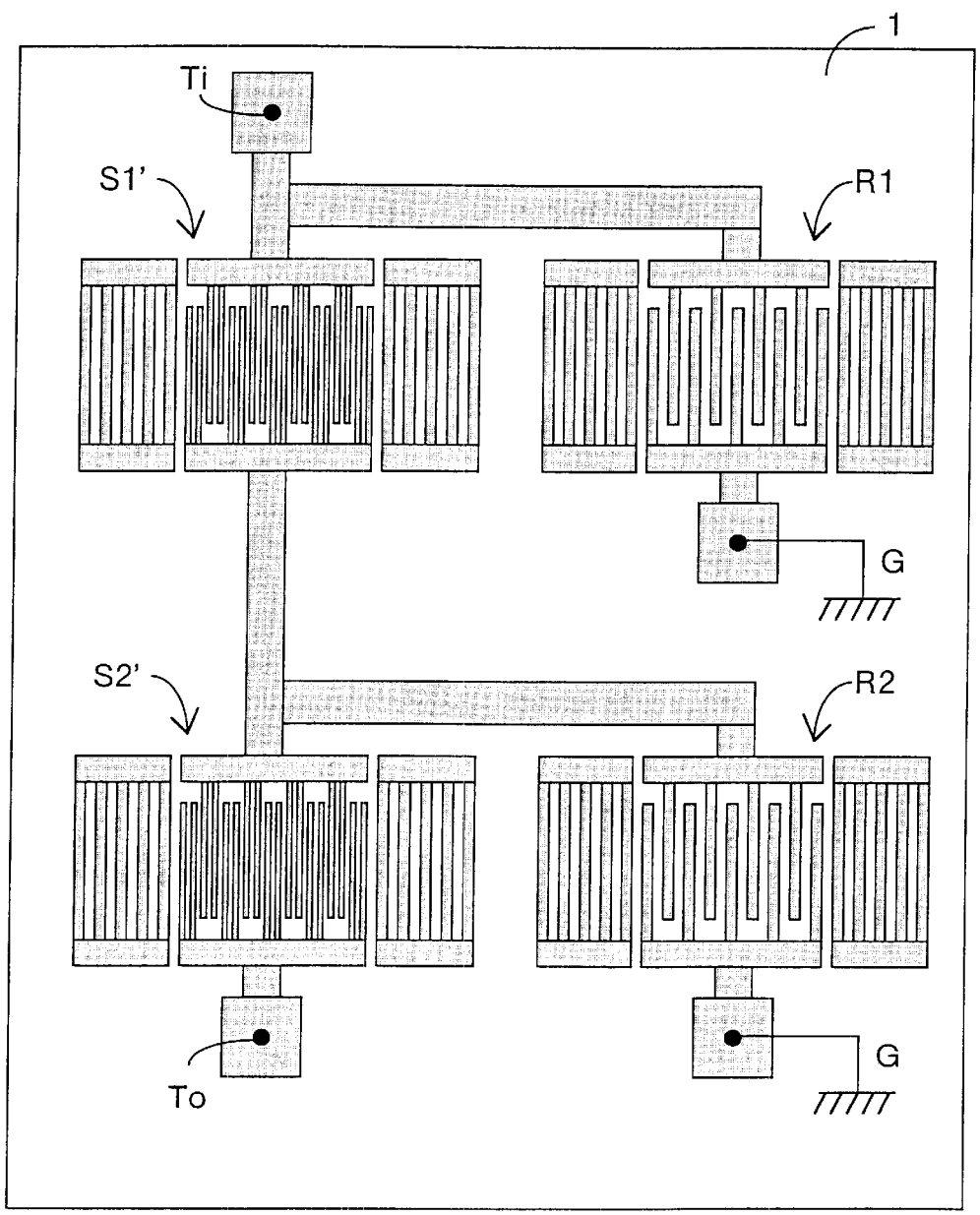
FIG. 15 is a constitutional diagram showing an example of a ladder type filter using the surface acoustic wave resonator according to the invention as a serial resonator.

FIG. 15 is a constitutional diagram showing an example of a ladder type filter of the invention, in which the surface acoustic wave resonators of the invention are used as the serial resonators S1' and S2' connected in serial, and the conventional surface acoustic wave resonators are used as the parallel resonators R1 and R2 connected in parallel.

In FIG. 15, the serial resonators S1' and S2' are one having four electrode fingers within the period pi of the interdigital transducer, and the parallel resonators R1 and R2 are one having two electrode fingers within the period pi. As similar to FIG. 13, the number of the serial resonators and the parallel resonators and the number of pairs thereof are not limited to those shown in the figure. The materials of the piezoelectric substrate and the electrode film are the same as those in FIG. 13.

Figure 16:
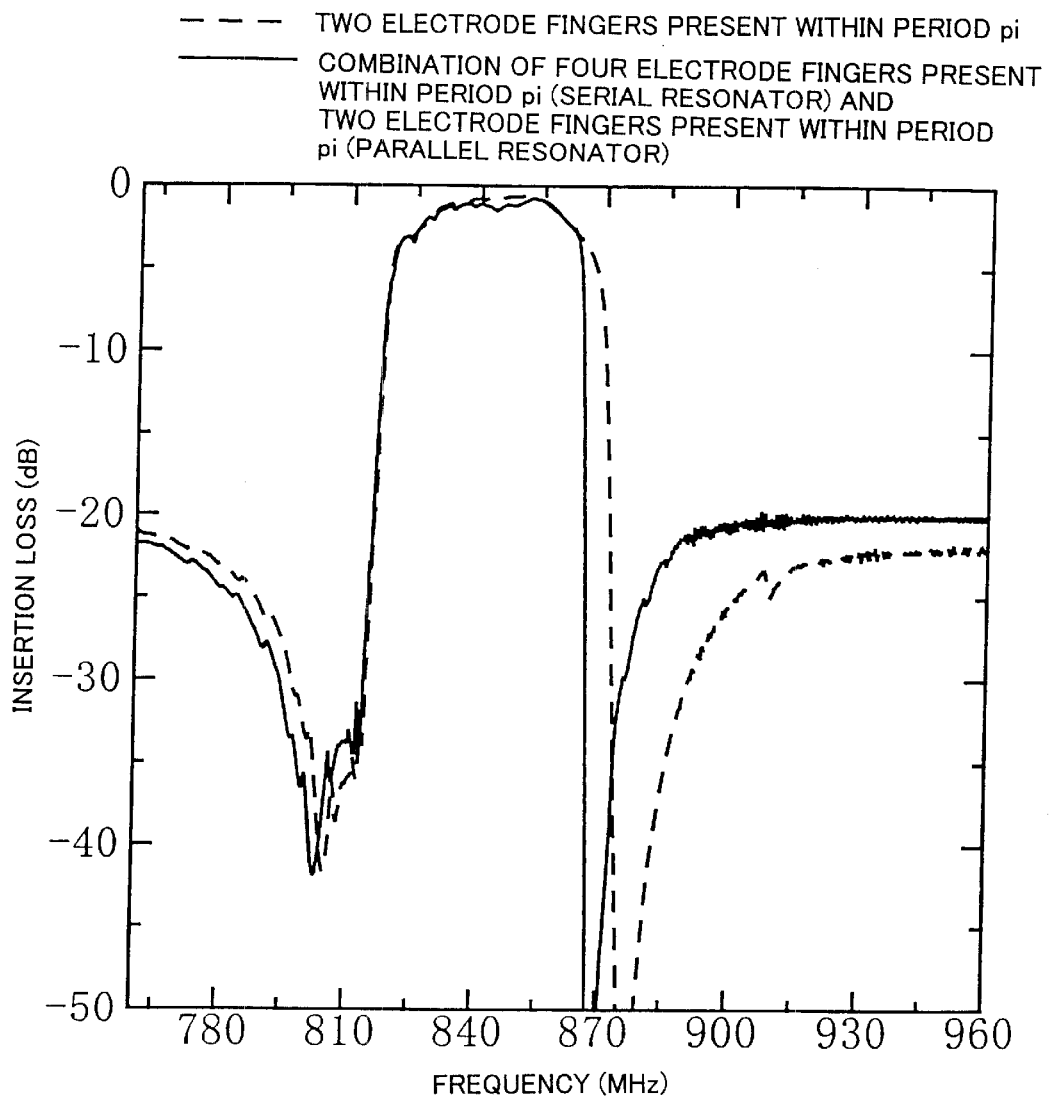
FIG. 16 is a diagram showing frequency characteristics of the ladder type filter using the surface acoustic wave resonator according to the invention as a serial resonator.

FIG. 16 is a diagram showing frequency characteristics of the ladder type filter according to the invention shown in FIG. 15.

The diagram shown by the solid line indicates the characteristic diagram of the ladder type filter according to the invention shown in FIG. 15, and the diagram shown by the broken line indicates the characteristic diagram of the conventional one, in which the number of the electrode fingers within the period pi is two.

The parallel resonators R1 and R2 have four electrode fingers within the period pi and a period pip of 4.8 $\mu$m, and the grating reflector thereof has periods that is a half of the periods of the interdigital transducer. The serial resonators S1' and S2' have four electrode fingers within the period pi, a period pis of 4.75 $\mu$m and Δpi of 0.05 $\mu$m, and the grating reflector thereof has periods that is a half of the periods of the interdigital transducer. The A-B distance L is pis×7/8 for the serial resonators and pip×1/2 for the parallel resonators, which is the same as the conventional one.

According to the diagram of the invention shown by the solid line in the figure, the 3 dB band width is 38 MHz, the 20 dB band width is 50.50 MHz, and the shape factor is 0.75.

On the other hand, according to the diagram shown by the broken line of the conventional electrode constitution, the 3 dB width is 38.75 MHz, the 20 dB band width is 56.25 MHz, and the shape factor is 0.69. Therefore, according to this configuration, a large shape factor and steep frequency characteristics can be obtained in the invention as compared to the conventional electrode constitution.

According to the present invention, three or more electrode fingers constituting the interdigital transducer of the surface acoustic wave resonator are provided within one period of the interdigital transducer, and therefore such frequency characteristics can be obtained that the resonance frequency and the antiresonance frequency thereof are approximated to each other.

Furthermore, because the resonance frequency and the antiresonance frequency can be approximated to each other, the ladder type surface acoustic wave filter constituted with the surface acoustic wave resonators of the invention can realize a band pass filter having a higher shape factor than the conventional one.

What is claimed is:

1. A surface acoustic wave resonator comprising a piezoelectric substrate, an interdigital transducer part which is formed on the piezoelectric substrate and is composed of plural electrode fingers having a period pi that is substantially equal to a wavelength of a surface acoustic wave to be excited, and at least one reflector arranged in the vicinity of the interdigital transducer part to reflect the surface acoustic wave excited by the interdigital transducer part in a direction parallel to a propagation direction of the surface acoustic wave, wherein the interdigital transducer part has three or more electrode fingers within the period pi, and the reflector is composed of plural gratings having a period pr that is equal to a half of a wavelength of a surface acoustic wave propagating in the reflector, wherein a distance L between a center position of a width of a propagation direction of a surface acoustic wave of one grating that is the nearest to the interdigital transducer part among the gratings of the reflector and a center position of a width of a propagation direction of a surface acoustic wave of a single electrode finger, and wherein the single electrode finger is the nearest electrode finger to the reflector among the electrode fingers of the interdigital transducer part, is from $(n/2+5/16)$ times to $(n/2+9/16)$ times a wavelength $\lambda$ of the surface acoustic wave excited by the interdigital transducer part, n=0 or a positive integer.

2. A surface acoustic wave resonator as claimed in claim 1, wherein the electrode fingers of the interdigital transducer part and the gratings of the reflector comprise electrodes having the same material and the same thickness.

3. A surface acoustic wave resonator as claimed in claim 2, wherein the period pr is a half of the period pi.

4. A surface acoustic wave resonator as claimed in claim 2, wherein the electrode fingers of the interdigital transducer part and the gratings of the reflector comprise a material of either aluminum or an aluminum alloy.

5. A ladder type surface acoustic wave filter comprising surface acoustic wave resonators connected in series and/or parallel, wherein at least one of the surface acoustic wave resonators comprises a surface acoustic wave resonator as claimed in one of claims 2 to 1.

6. A ladder type surface acoustic wave filter comprising surface acoustic wave resonators connected in series and/or parallel, wherein only surface acoustic wave resonators connected in series comprise a surface acoustic wave resonator as claimed in one of claims 2 to 1.

* * * * *